United States Patent
Takahashi

(10) Patent No.: US 8,107,299 B2
(45) Date of Patent: Jan. 31, 2012

(54) SEMICONDUCTOR MEMORY AND METHOD AND SYSTEM FOR ACTUATING SEMICONDUCTOR MEMORY

(75) Inventor: Motoi Takahashi, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 254 days.

(21) Appl. No.: 12/620,172

(22) Filed: Nov. 17, 2009

(65) Prior Publication Data

US 2010/0128535 A1 May 27, 2010

(30) Foreign Application Priority Data

Nov. 27, 2008 (JP) .................................. 2008-302644

(51) Int. Cl.
*G11C 16/06* (2006.01)

(52) U.S. Cl. ......... 365/185.23; 365/185.11; 365/185.18; 365/185.28; 365/185.29

(58) Field of Classification Search ............. 365/185.11, 365/185.18, 185.23, 185.28, 185.29
See application file for complete search history.

(56) References Cited

U.S. PATENT DOCUMENTS

| | | | |
|---|---|---|---|
| 5,073,513 A * | 12/1991 | Lee | 438/267 |
| 7,733,696 B2 * | 6/2010 | Lee et al. | 365/185.05 |
| 2001/0005015 A1 | 6/2001 | Futatsuyama et al. | |
| 2005/0094431 A1 * | 5/2005 | Sato et al. | 365/154 |
| 2005/0270851 A1 | 12/2005 | Kato et al. | |
| 2006/0083064 A1 * | 4/2006 | Edahiro et al. | 365/185.17 |
| 2007/0121359 A1 * | 5/2007 | Kanda | 365/51 |

FOREIGN PATENT DOCUMENTS

| | | |
|---|---|---|
| JP | 2001-189087 A | 7/2001 |
| JP | 2005-346819 A | 12/2005 |

* cited by examiner

*Primary Examiner* — Hoai V Ho
(74) *Attorney, Agent, or Firm* — Arent Fox LLP

(57) ABSTRACT

A semiconductor memory includes a memory cell having a cell transistor and a selection transistor, a control gate line coupled to a gate electrode of the cell transistor, a selection gate line coupled to a gate electrode of the selection transistor, a selection gate driver configured to apply a voltage to the selection gate line, a switch circuit configured to couple the control gate line to the selection gate line, and a level converting unit coupled to the control gate line and a voltage line and configured to convert a voltage of the control gate line into a voltage of the voltage line.

18 Claims, 21 Drawing Sheets

FIG. 6

| | | RD | PRG | ERS |
|---|---|---|---|---|
| SEC0 | CG0 | 1.8V | 1.8V → 9V | -9V |
| | SG0 | 1.8V | 1.8V | FLT |
| | SL0 | 0V | 5V | FLT |
| | BL0 | 1.8V | 0V | FLT |
| | CG1-15 | 0V | 0V | -9V |
| | SG1-15 | 0V | 0V | FLT |
| | SL1-3 | 0V | 0V | FLT |
| | BL1-1023 | 0V | 1.8V | FLT |
| | PW0 | 0V | 0V | 9V |
| SEC1-3 | CG0-15 | 0V | 0V | FLT |
| | SG0-15 | 0V | 0V | FLT |
| | SL0-3 | 0V | 1.8V | FLT |
| | BL0-1023 | 0V | 0V | FLT |
| | PW1-3 | 0V | 0V | 0V |

FIG. 14

|  |  | RD | PRG | ERS |
|---|---|---|---|---|
| SEC0 | CG0 | 1.8V | 1.8V→9V | -9V |
|  | SG0 | 1.8V | 1.8V | FLT |
|  | SL0 | 0V | 5V | FLT |
|  | BL0 | 1.8V | 0V | FLT |
|  | CG1-15 | 1.8V | 1.8V→9V | -9V |
|  | SG1-15 | 0V | 0V | FLT |
|  | SL1-3 | 0V | 0V | FLT |
|  | BL1-1023 | 0V | 1.8V | FLT |
|  | PW0 | 0V | 0V | 9V |
| SEC1-3 | CG0-15 | 0V | 0V | FLT |
|  | SG0-15 | 0V | 0V | FLT |
|  | SL0-3 | 0V | 0V | FLT |
|  | BL0-1023 | 0V | 1.8V | FLT |
|  | PW1-3 | 0V | 0V | 0V |

FIG. 20

| | | RD | PRG | ERS |
|---|---|---|---|---|
| SEC0 | CG0 | 1.8V | 1.8V → 9V | -9V |
| | SG0 | 1.8V | 1.8V | FLT |
| | SL0 | 0V | 5V | FLT |
| | BL0 | 1.8V | 0V | FLT |
| | CG1-3 | 0V | 0V | -9V |
| | SG1-15 | 0V | 0V | FLT |
| | SL1-3 | 0V | 0V | FLT |
| | BL1-1023 | 0V | 1.8V | FLT |
| | PW0 | 0V | 0V | 9V |
| SEC1-3 | CG0-15 | 0V | 0V | FLT |
| | SG0-15 | 0V | 0V | FLT |
| | SL0-3 | 0V | 0V | FLT |
| | BL0-1023 | 0V | 1.8V | FLT |
| | PW1-3 | 0V | 0V | 0V |
| | FSGB | 1.8V | 1.8V | 0V |
| | FSGN | 0V | 0V | 1.8V |

US 8,107,299 B2

SEMICONDUCTOR MEMORY AND METHOD AND SYSTEM FOR ACTUATING SEMICONDUCTOR MEMORY

CROSS-REFERENCE TO RELATED APPLICATIONS

This application is based upon and claims the benefit of priority from the prior Japanese Patent Application No. 2008-302644, filed on Nov. 27, 2008, the entire contents of which are incorporated herein by reference.

BACKGROUND

1. Field of the Invention

The present invention relates to a semiconductor memory that has memory cells including cell transistors and selection transistors.

2. Description of Related Art

As a semiconductor memory that has memory cells including cell transistors and selection transistors, a flash memory is known. A memory cell in which a control gate line coupled to a gate of a cell transistor and a selection gate line coupled to a gate of a selection transistor are driven by using a common decoder is disclosed in, for example, Japanese Patent Application Laid-Open Publication No. 2001-189087 and Japanese Patent Application Laid-Open Publication No. 2005-346819.

SUMMARY

According to an aspect of the invention, a semiconductor memory includes a memory cell including a cell transistor and a selection transistor, a control gate line coupled to a gate electrode of the cell transistor, a selection gate line coupled to a gate electrode of the selection transistor, a selection gate driver configured to apply voltage to the selection gate line, a switch circuit configured to couple the control gate line to the selection gate line, and a level converting unit coupled to the control gate line and a voltage line and configured to convert voltage of the control gate line into voltage of the voltage line.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 illustrates an example of voltages of signal lines applied when the semiconductor memory illustrated in FIG. 1 operates;

FIG. 14 illustrates an example of voltages of signal lines applied when the semiconductor memory illustrated in FIG. 12 operates;

FIG. 20 illustrates an example of voltages of signal lines applied when the semiconductor memory illustrated in FIG. 19 operates.

DESCRIPTION OF THE PREFERRED ASPECTS

When a gate capacity of a central transistor is large or when voltage applied to a gate of the cell transistor is large, a driver that drives the cell transistor is desirably formed by a transistor having a high withstanding voltage. Since the transistor having a high withstanding voltage has low operation speed. To quickly drive the cell transistor, a driver with large circuit size having a quick driving ability is desirable. In particular, it is desirable to quickly drive the cell transistor to reduce readout access time.

Aspects of the present invention are explained below with reference to the drawings. In the figures, a plurality of signal lines are indicated by bold lines. A part of a block to which the bold lines are coupled has a plurality of circuits. Signs same as signal names are used for the signal lines through which signals are transmitted. Signals with "/" at the top indicate negative logics. Double squares in the figures indicate external terminals. The external terminals are, for example, pads on a semiconductor chip or leads of a package in which the semiconductor chip is stored. Signs same as those of terminal names are used for signals supplied via the external terminals.

Figure 1:
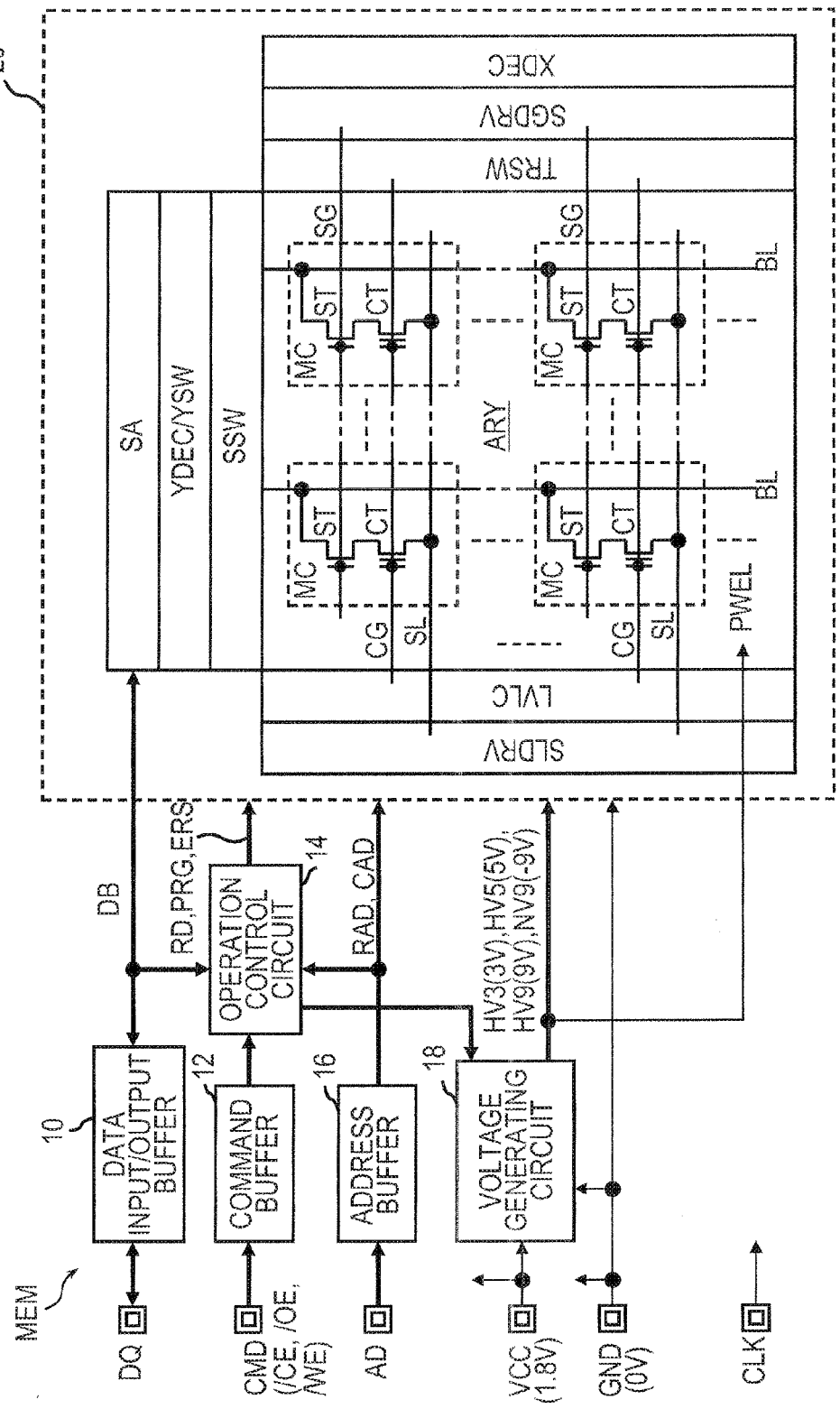
FIG. 1 illustrates a semiconductor memory according to an aspect of the present invention.

FIG. 1 illustrates a semiconductor memory MEM according to an aspect of the present invention. For example, the semiconductor memory MEM is a flash memory of a NOR type. The semiconductor memory MEM operates synchronously with a clock signal CLK but may operate asynchronously with the clock signal CLK. The semiconductor memory MEM may be designed as a memory macro mounted on a system LSI or the like or may be designed as a semiconductor storage device encapsulated in a package.

The semiconductor memory MEM is formed over, for example, a silicon substrate by using a CMOS process. The semiconductor memory MEM includes a data input/output buffer 10, a command buffer 12, an operation control circuit 14, an address buffer 16, a voltage generating circuit 18, and a memory core 20.

The data input/output buffer 10 outputs readout data, which is output from the memory core 20 via a data bus DB, to a data terminal DQ. The data input/output buffer 10 outputs write data, which is supplied to the data terminal DQ, to the memory core 20 via the data bus DB. The number of bits of the data terminal DQ is, for example, 16 bits.

The command buffer 12 receives a command signal CMD for actuating the memory core 20 and outputs the received command signal CMD to the operation control circuit 14. For example, the command signal CMD includes: a chip enable signal /CE, an output enable signal /OE, and a write enable signal /WE.

The operation control circuit 14 outputs, according to the command signal CMD from the command buffer 12, a control signal as a timing signal for actuating the memory core 20 to the memory core 20. The control signal may be generated by using not only the command signal CMD but also at least one bit of a data signal DB and address signals RAD and CAD. The control signal includes a readout signal RD, a program signal PGM, and an erasing signal ERS. When readout operation for reading out data stored in memory cells MC is executed according to a readout command, the readout signal RD is output. When program operation (e.g. a writing operation) for programming logic 0 in the memory cells MC is executed according to a program command (e.g. a writing command), the program signal PGM is output. When erasing operation for erasing the memory cells MC into a state of logic 1 is executed according to an erasing command, the erasing signal ERS is output.

The address buffer 16 outputs, for example, higher order bits of an address signal AD received by an address terminal as a row address signal RAD and outputs lower order bits of the address signal AD as a column address signal CAD. The memory cell MC to be accessed is selected according to the row address signal RAD and the column address signal CAD. Specifically, the row address signal (RAD) is used for selecting control gate lines CG, selection gate lines SG, and source lines SL. The column address signal CAD is used for selecting bit lines BL.

The voltage generating circuit 18 generates plural kinds of internal voltages HV3, HV5, HV9, and NV9 based on, for example, power supply voltage VCC of 1.8 V, which is supplied to a power supply terminal, and ground voltage GND of 0 V. The voltage generating circuit 18 operates synchronously with a control signal from the operation control circuit 14. The internal voltages HV3, HV5, HV9, and NV9 are, for example, 3 V, 5 V, 9 V, and −9 V, respectively. For example, the internal voltages HV3, HV5, HV9, and NV9 are generated by a pump circuit that makes use of capacitive coupling. The internal voltages HV3, HV5, HV9, and NV9 are supplied to the memory core 20 via an internal voltage line. The internal voltage HV9 is also supplied to a p-type well region of the memory cell array during the erasing operation. The power supply voltage VCC and the ground voltage GND are also supplied to other circuits.

The memory core 20 includes a source driver unit SLDRV, a level converting unit LVLC, a switch unit TRSW, a selection-gate driver unit SGDRV, a word decoder unit XDEC, a sense amplifier unit SA, a column decoder unit YDEC, a column switch unit YSW, a selector switch SSW, and a memory cell array ARY. In this aspect, a control gate driver that drive the control gate lines CG is not formed. The circuits of the memory core 20 respectively operate synchronously with control signals from the operation control circuit 14.

The source driver unit SLDRV selects any one of source lines SL according to a decode signal generated by the row address signal RAD. The decode signal may be generated by the word decoder unit XDEC or may be generated by another decoder. The level converting unit LVLC converts the voltage of the control gate lines CG into a certain voltage.

The switch unit TRSW couples the control gate lines CG to the selection gate lines SG. The selection gate driver unit (SGDRV) selects any one of the selection gate lines SG according to a row decode signal from the word decoder unit XDEC. The word decoder unit XDEC generates, according to the row address signal RAD, the row decode signal for selecting the selection gate lines SG. In this aspect, since the control gate lines CG are driven by using voltage supplied to the selection gate line SG, the word decoder unit XDEC is provided in common to the selection gate lines SG and the control gate lines CG.

A sense amplifier of the sense amplifier unit SA amplifies, during readout operation, a data signal read out from the memory cells MC via the bit lines BL and outputs the data signal to the data bus DB as readout data. Specifically, the sense amplifier determines logic of the data signal according to an amount of an electric current flowing through the bit lines BL. The column decoder unit YDEC generates, according to the column address signal CAD, a column decode signal for selecting the bit lines BL. The column switch unit YSW couples, according to the column decode signal, one of global bit lines GEL illustrated in FIG. 2, to the sense amplifier. The selector switch SSW couples, according to the column decode signal, any one of the bit lines BL to the global bit lines GBL for each of data terminals.

The memory cell array ARY includes a plurality of memory cells MC arranged in a matrix shape. The control gate lines CG, the source lines SL, and the selection gate lines SG are coupled in common to columns of the memory cells MC arranged in the horizontal direction in the figure. The bit lines BL are coupled in common to columns of the memory cells MC arranged in the vertical direction in the figure. The memory cells MC have cell transistors CT and selection transistors ST arranged in series between the source lines SL and the bit lines BL.

The cell transistors CT have the structure of nMOS transistors and include floating gates that accumulate electrons and control gates coupled to the control gate lines CG. The cell transistors CT may be formed by using trap gates in which electrons are accumulated in certain places. The selection transistors ST are nMOS transistors, gates of which are coupled to the selection gate lines SG.

For example, the selection transistors ST are formed by using a CMOS process having withstanding voltage of 2 V. The selection transistors ST have gate insulating films thinner than those of the cell transistors CT and operate faster than the cell transistors CT. For example, the cell transistors are formed by using a CMOS process having withstanding voltage of 10 V.

Figure 2:
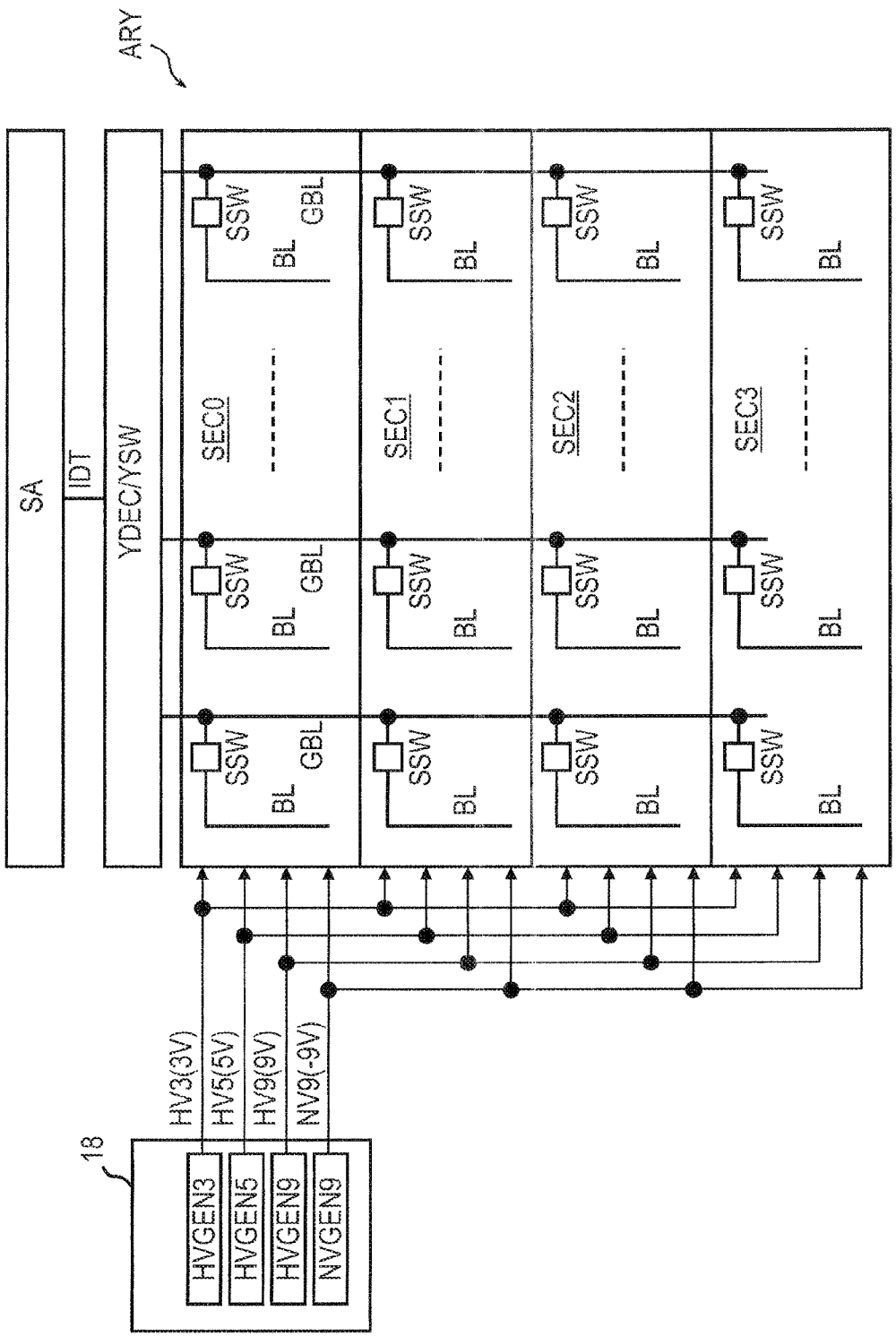
FIG. 2 illustrates an example of a voltage generating circuit and a memory cell array illustrated in FIG. 1.

FIG. 2 illustrates an example of the voltage generating circuit 18 and the memory cell array ARY illustrated in FIG. 1. The voltage generating circuit 18 includes voltage generators HVGEN3, HVGEN5, HVGEN9, and NVGEN9 that generate the internal voltages HV3, HV5, HV9, and NV9, respectively. The voltage generators HVGEN3, HVGEN5, HVGEN9, and NVGEN9 respectively operate synchronously with control signals from the operation control circuit 14. Although not specifically limited, the voltage generators HVGEN3, HVGEN5, HVGEN9, and NVGEN9 generate internal voltage, e.g., any one of HV3, HV5, HV9, and HV9 when the memory core 20 uses the internal voltage. Consequently, the pump circuit may be prevented from always operating, and a consumed current of the semiconductor memory MEM may be reduced. In particular, a standby current may be reduced. The voltage generator HVGEN3 that has a relatively small consumed current and generates the internal voltage HV3 necessary during the readout operation may be allowed to always operate. Consequently, time during which the internal voltage HV3 rises to a certain value may be saved and readout access time may be reduced during the readout operation.

The memory cell array ARY includes, for example, four sectors SEC (SEC0 to SEC3). The number of sectors SEC may be one, two, eight, or sixteen. The sectors SEC0 to SEC3 are identified according to, for example, a value of higher order 2 bits of the row address signal RAD. The bit lines BL in the sectors SEC0 to SEC3 are coupled to the common global bit lines GBL via sector switches SSW. Any one of the global bit lines GBL coupled to the column switch unit YSW is coupled to the sense amplifier SA via an internal data line IDT. In FIG. 2, the bit lines BL corresponding to one data terminal DQ are illustrated. In one aspect, the sectors SEC0 to SEC3 have a configuration illustrated in FIG. 2 for each of data terminals DQ. Since the sectors SEC0 to SEC3 have the same circuit configuration, in the following explanation, the sector SEC0 is explained.

Figure 3:
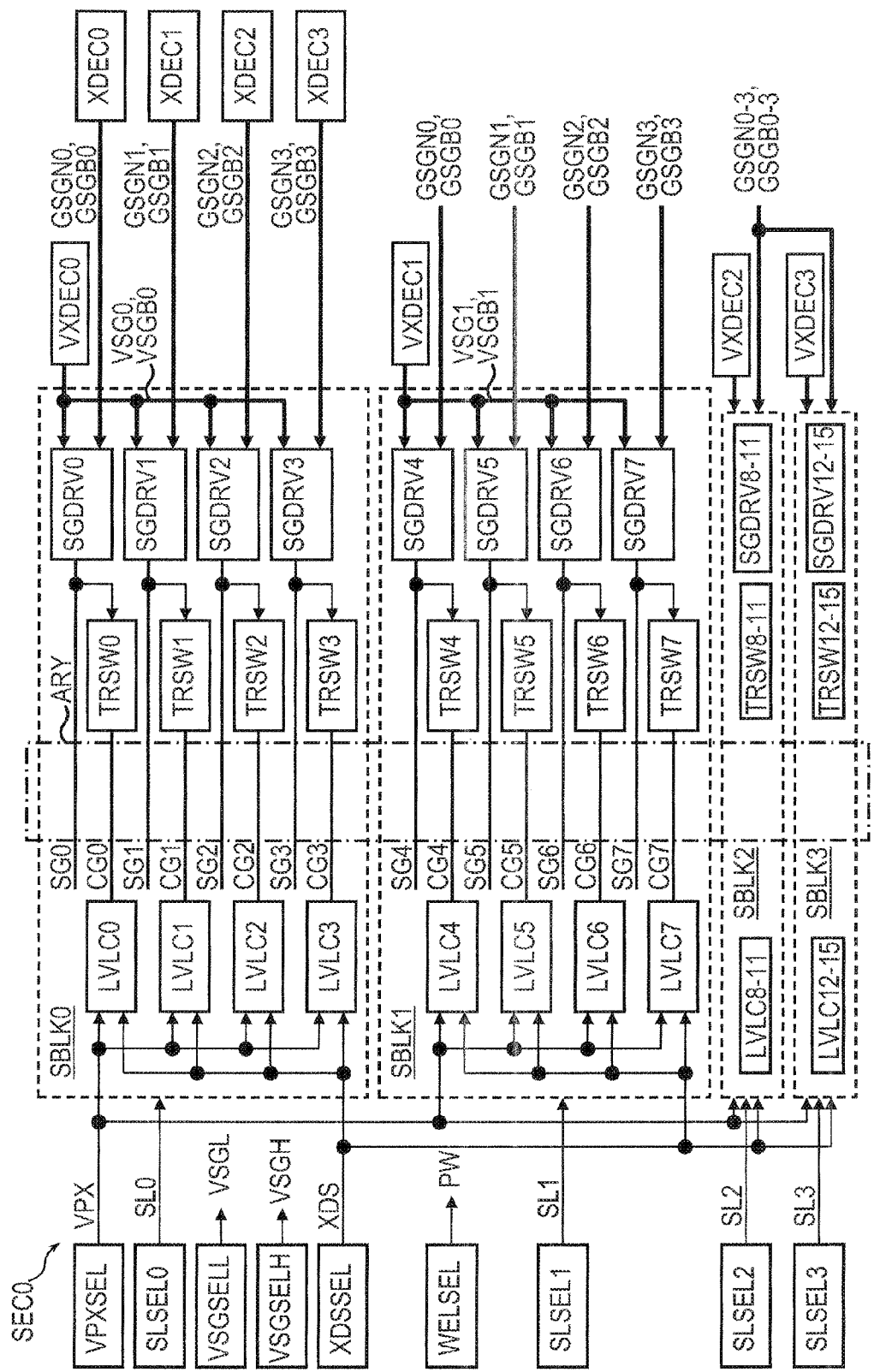
FIG. 3 illustrates an example of a sector illustrated in FIG. 2.

FIG. 3 illustrates an example of the sector SEC0 illustrated in FIG. 2. For example, the sector SEC0 includes four sub-blocks SBLK (SBLK0 to SBLK3), internal voltage selectors VPXSEL, VSGSELL, VSGSELH, XDSSEL, WELSEL, and SLSEL (SLSEL0 to SLSEL3), and word decoders XDEC (XDEC0 to XDEC3) and VXDEC (VXDEC0 to VXDEC3). The internal voltage selectors VPXSEL, VSGSELL, VSGSELH, XDSSEL, WELSEL, and SLSEL0 to SLSEL3 and the word decoders XDEC0 to XDEC3 and VXDEC0 to VXDEC3 respectively operate synchronously with control signals from the operation control circuit 14. The number of sub-blocks SBLK may be one, two, eight, or sixteen.

The internal voltage selector VPXSEL is applied with the internal voltages HV3 and HV9 and the ground voltage GND and outputs the internal voltages HV3 and HV9 or the ground voltage GND to a voltage line VPX. The internal voltage selector VSGSELL is applied with the power supply voltage VCC, the internal voltage HV3, and the ground voltage GND and outputs any one of the power supply voltage VCC, the internal voltage HV3, and the ground voltage GND to a voltage line VSGL. The internal voltage selector VSGSELH is applied with the power supply voltage VCC, the internal voltage HV3. The ground voltage GND and outputs any one of the power supply voltage VCC, the internal voltage HV3, and the ground voltage GND to a voltage line VSGH.

The internal voltage selector XDSSEL is applied with the internal voltage NV9 and the ground voltage GND and either outputs the internal voltage NV9 or the ground voltage GND to a voltage line XDS. The internal voltage selector WELSEL is applied with the internal voltage HV9 and the ground voltage GND and outputs either the internal voltage HV9 or the ground voltage GND to a voltage line PW. The voltage line PW is coupled to a p-type well region PWEL of the memory cell array ARY in the sector SEC0. The p-type well region is a region in which an nMOS transistor is formed.

The internal voltage selector SLSEL0 is applied with the internal voltage HV5 and the ground voltage GND and outputs either the internal voltage HV5 or the ground voltage GND to a source line SL0. Similarly, the internal voltage selector SLSEL1 (or SLSEL2 or SLSEL3) is applied with the internal voltage HV5 and the ground voltage GND and outputs either the internal voltage HV5 or the ground voltage GND to a source line SL1 (or SL2 or SL3). The internal voltage selectors SLSEL0 to SLSEL3 are provided in the source driver unit SLDRV and operate as source drivers.

The internal voltage selectors VPXSEL, VSGSELL, VSGSELH, XDSSEL, and WLSEL are provided in common in the sub-blocks SBLK0 to SBLK3 and provided for each of the sectors SEC0 to SEC3. In other words, the voltage lines VPX, VSGL, VSGH, XDS, and PW are wired for each of the sectors SEC0 to SEC3. The source lines SL0 to SL3 are respectively coupled to the sub-blocks SBLK0 to SBLK3 and provided for each of the sectors SEC0 to SEC3.

The word decoders VXDEC0 to VXDEC3 have the same circuit configuration. The word decoder VXDEC0 outputs row decode signals VSG0 and VSGB0 according to a 2-bit value of the row address signal RAD. The row decode signals VSG0 and VSGB0 are respectively set to the high-level VCC and the low-level GND when the memory cells MC corresponding thereto are selected. Similarly, the word decoders VXDEC1, VXDEC2, or VXDEC3 outputs row decode signals VSG1 and VSGB1 or VSG2 and VSGB2, or VSG3 and VSGB3 according to a 2-bit value of the row address signal RAD. The word decoders VXDEC0 to VXDEC3 are provided for each of the sub-blocks SBLK0 to SBLK3 and provided for each of the sectors SEC0 to SEC3.

The word decoders XDEC0 to XDEC3 have the same circuit configuration. The word decoders XDEC0 to XDEC3 output row decode signals GSGN0 to GSGN3 and GSGB0 to GSGB3 according to a 2-bit value of the row address signal RAD. 2 bits of the row address signal RAD supplied to the word decoders XDEC0 to XDEC3 are different from 2 bits of the row address signal RAD supplied to the word decoders VXDEC0 to VXDEC3. The row decode signals GSGN0 and GSGB0 are set to the low-level GND when the memory cells MC corresponding thereto are selected in the readout operation and the program operation. The row decode signals GSGN0 and GSGB0 are set to the high-level VCC when the memory cells MC corresponding thereto are not selected in the readout operation and the program operation. The same holds true for the row decode signals GSGN1 to GSGN3 and GSGB1 to GSGB3. The word decoders XDEC0 to XDEC3 are provided in common in the sub-blocks SBLK0 to SBLK3 and provided for each of the sectors SEC0 to SEC3.

The word decoders VXDEC0 to VXDEC3 and XDEC0 to XDEC3 are provided in the word decoder unit XDEC. Any one of the sub-blocks SBLK0 to SBLK3 is selected by the word decoders VXDEC0 to VXDEC3. Any one of the four selection gate drivers SGDRV, for example, SGDRV0 to SGDRV3 in the sub-blocks SBLK0 to SBLK3, is selected by the word decoders XDEC0 to XDEC3. In the readout operation and the program operation further discussed below, only one selection gate driver SGDRV selected by both the word decoders VXDEC0 to VXDEC3 and XDEC0 to XDEC3 operates.

Since the sub-blocks SBLK0 to SBLK3 have the same circuit configuration, only the sub-block SBLK0 is explained. The sub-blocks SBLK0 have four signal line pairs CG0/SG0, CG1/SG1, CG2/SG2, and CG3/SG3. In other words, the sectors SEC0 to SEC3 having the four sub-blocks SBLK0 to SBLK3 have sixteen signal line pairs CG/SG. The sub-block SBLK0 have level converting circuits LVLC (LVLC0 to LVLC3), switch circuits TRSW (TRSW0 to TRSW3), and selection gate drivers SGDRV (SGDRV0 to SGDRV3) in association with the four signal line pairs CG/SG. The level converting circuits LVLC0 to LVLC3 may be formed on outer sides of the sub-blocks SBLK0 to SBLK3.

The level converting circuits LVLC0 to LVLC3 have the same circuit configuration. The switch circuits TRSW0 to TRSW3 have the same circuit configuration. The selection gate drivers SGDRV0 to SGDRV3 have the same circuit configuration. The number of signal line pairs CG/SG wired in the sub-blocks SBLK0 to SBLK3 may be one pair, two pairs, eight pairs, or sixteen pairs. The number of level converting circuits LVLC0 to LVLC3, switch circuits TRSW0 to TRSW3, selection gate drivers SGDRV0 to SGDRV3, and word decoders XDEC0 to XDEC3 is changed according to the number of signal line pairs CG/SG.

The level converting circuits LVLC0 to LVLC3 are provided in the level converting unit LVLC. The switch circuits TRSW0 to TRSW3 are provided in the switch unit TRSW. The selection gate drivers SGDRV0 to SGDRV3 are provided in the selection gate driver unit SGDRV. The level converting circuits LVLC0 to LVLC3 and the switch circuits TRSW0 to TRSW3 are coupled to control gate lines CG0 to CG3, respectively. The selection gate drivers SGDRV0 to SGDRV3 are coupled to selection gate lines SG0 to SG3, respectively. The selection gate drivers SGDRV0 to SGDRV3 receive the row decode signal VSG0 or VSGB0, any one of the row decode signals GSGN0 to GSGN3, and any one of the row decode signals GSGB0 to GSGB3 and operate.

Figure 4:
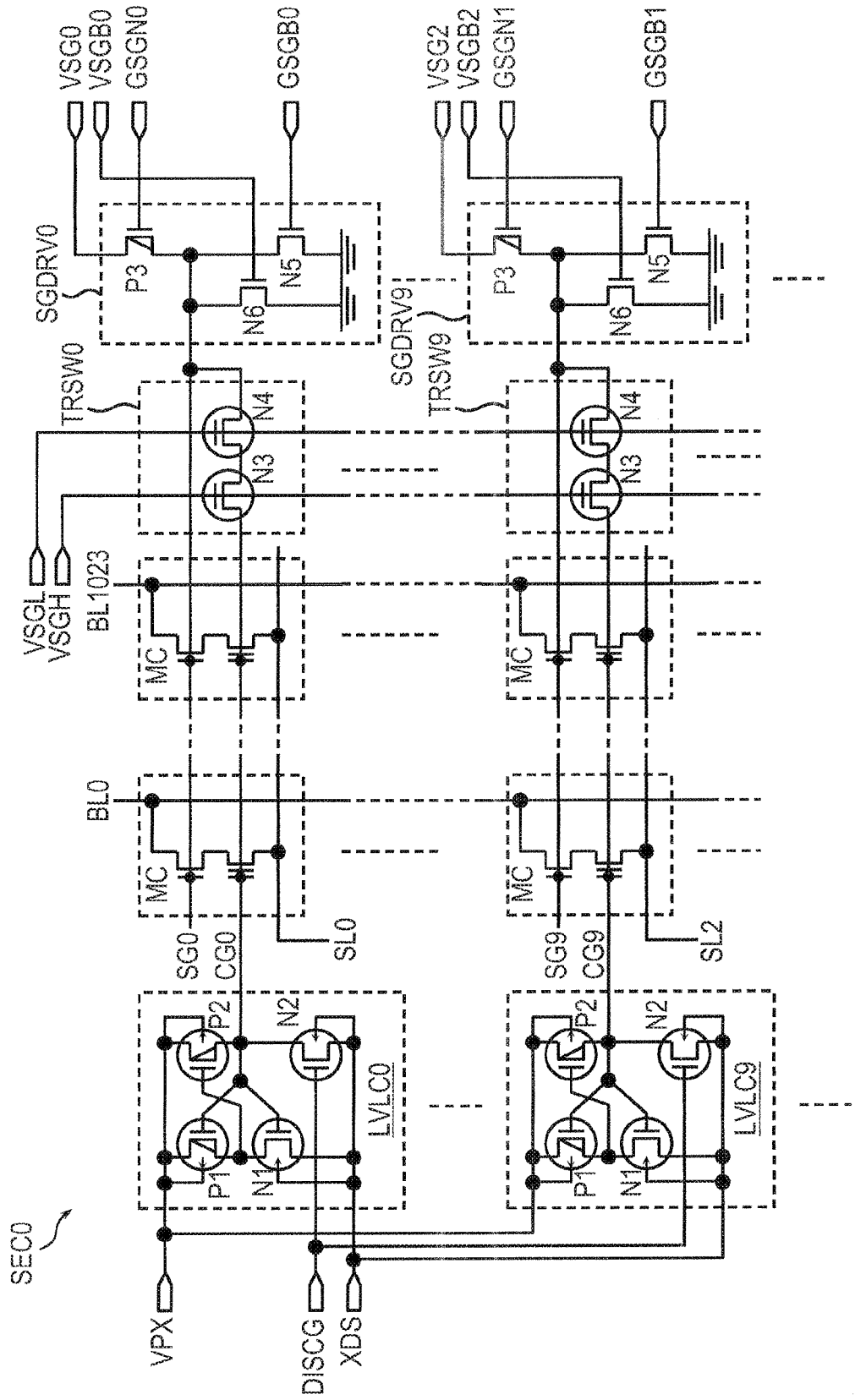
FIG. 4 illustrates a main part of the sector illustrated in FIG. 3.

FIG. 4 illustrates a main part of the sector SEC0 illustrated in FIG. 3. A configuration of the other sectors SEC1 to SEC3 is the same as that illustrated in FIG. 4. Transistors attached with slashes are pMOS transistors. Transistors without slashes are nMOS transistors. Transistors surrounded by circles are manufactured by, for example, a CMOS process having 10 V withstanding voltage. The other transistors are manufactured by a CMOS processing having a 2 V withstanding voltage. Arrows attached to the transistors indicate formation areas of the transistors. Since level converting circuits LVLC0 to LVLC15, switch circuits TRSW0 to TRSW15, and selection gate drivers SGDRV0 to SGDRV15 are respectively the same circuits, only circuits coupled to the control gate line CG0 and the selection gate line SG0 are explained. Although not specifically limited, the memory cell array ARY includes 1024 bit lines BL0 to BL1023.

The level converting circuit LVLC0 includes pMOS transistors P1 and P2, sources of which are coupled to the voltage line VPX, and an nMOS transistor N1, and a source of which is coupled to the voltage line XDS. Gates of the transistors P1 and N1 and a drain of the transistor P2 are coupled to the control gate line CG0. Drains of the transistors P1 and N1 are coupled to a gate of the transistor P2. The level converting circuit LVLC0 sequentially turns on the transistors N1 and P1 and converts the voltage of the control gate line CG0 into the voltage of the voltage line VPX, for example, 1.8 V or 9 V. when the voltage of the control gate line CG0 rises in the readout operation and the program operation. Specifically, the level converting circuit LVLC0 starts voltage converting operation when the voltage of the control gate line CG0 exceeds a threshold voltage of the transistor N1, for example, 0.3 V.

The nMOS transistor N2 receives a control signal DISCG in the gate, couples the source to the voltage line XDS, and couples the drain to the control gate line CG0. In the erasing operation, the nMOS transistor N2 receives a 0 V control signal DISCG and a −9 V control signal XDS and sets the control gate line CG0 to negative voltage, for example, −9 V. The transistor N2 may be formed on an outer side of the level converting circuit LVLC0.

The switch circuit TRSW0 includes nMOS transistors N3 and N4 arranged in series between the control gate line CG0 and the selection gate line SG0. A gate of the transistor N3 is coupled to the voltage line VSGH. A gate of the transistor N4 is coupled to the voltage line VSGL. In the readout operation, the voltage lines VSGH and VSGL are set to 3 V. The control gate line CG0 is coupled to the selection gate line SG0. In the program operation, the voltage lines VSGH and VSGL are set to 1.8 V. The control gate line CG0 is coupled to the selection gate line SG0.

In the erasing operation, the voltage line VSGH is set to −9 V to turn off the transistor N3. The voltage line VSGL is set to 0 V to turn off the transistor N4. The control gate line CG0 is set to −9 V. 9 V is applied to p-type well regions PWEL of the memory cells MC. The selection gate line SG0, set in a floating state during the erasing operation, is charged to positive voltage according to a coupling phenomenon when 9 V is applied to the p-type well regions PWEL. Since the control gate line CG0 is set to −9 V, it is likely that voltage substantially equal to or higher than 10 V is applied, for example, between the pair of transistors N3 and N4, i.e., at both the ends of the switch circuit TRSW0. However, since both the transistors N3 and N4 are off, voltage exceeding withstanding voltage may be prevented from being applied to the transistors N3 and N4.

When voltage applied between the transistors N3 and N4 is lower than 12 V during the erasing operation, the transistor N4 may be formed by a transistor having a normal withstanding voltage. 12 V is a sum of withstanding voltage, for example, 10 V, of a transistor having a high width standing voltage and withstanding voltage, for example, 2 V, of a normal transistor.

The selection gate driver SGDRV0 includes a pMOS transistor P3 and nMOS transistors N5 and N6. A source of the transistor P3 is coupled to the row decode signal line VSG0, a gate thereof is coupled to the row decode signal line GSGN0, and a drain thereof is coupled to the selection gate line SG0. A source of the transistor N5 is coupled to the ground line, a gate thereof is coupled the row decode signal line GSGB0, and a drain thereof is coupled to the selection gate line SG0. A source of the transistor N6 is coupled to the ground line, a gate thereof is coupled to the row decode signal line VSGB0, and a drain thereof is coupled to the selection gate line SG0.

The selection gate driver SGDRV0 is selected when the low-level row decode signals GSGN0 and GSGB0, the low-level row decode signal VSGB0, and the high-level row decode signal VSG0 are received in the readout operation and the program operation. In other words, the selection gate driver SGDRV0 is enabled when the selection gate driver SGDRV0 is selected by both the word decoders XDEC0 and VXDEC. At this point, the selection gate driver SGDRV0 outputs high-level voltage, for example, 1.8 V of the row decode signal line VSG0 to the selection gate line SG0.

In the erasing operation, the selection gate driver SGDRV0 receives the high-level row decode signals GSGN0 and VSG0 and the low-level row decode signals GSGB0 and VSGB0 and sets the selection gate line SG0 in the floating state.

As illustrated in FIG. 1, the switch circuit TRSW is arranged between the memory cell array ARY and the selection gate driver unit SGDRV. Consequently, an output of the selection gate driver SGDRV may be coupled to the control gate line CG in the shortest distance. Therefore, as further discussed below, a high level output from the selection gate driver SGDRV may be quickly transmitted to the control gate line CG.

Figure 5:
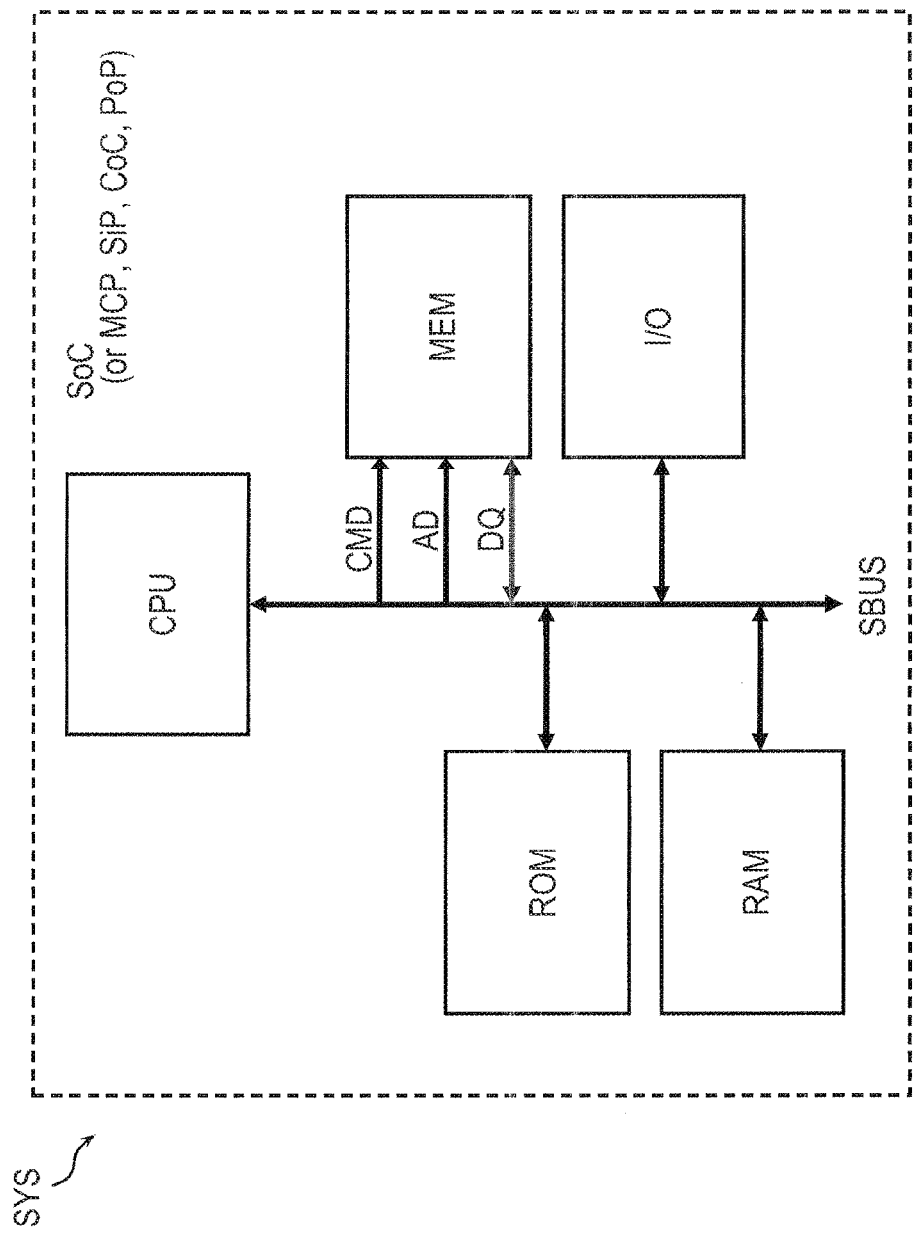
FIG. 5 illustrates an example of a system mounted with the semiconductor memory illustrated in FIG. 1.

FIG. 5 illustrates an example of a system SYS mounted with the semiconductor memory MEM illustrated in FIG. 1. The system SYS configures at least a part of a microcomputer system such as a portable apparatus. In aspects further discussed below, the semiconductor memory MEM is mounted on the system SYS same as that illustrated in FIG. 5. The system SYS includes a system on chip (SoC) in which a plurality of macros are integrated on a silicon substrate. Alternatively, the system SYS includes a multi-chip package MCP in which a plurality of chips are integrated on a package substrate. Alternatively, the system SYS includes a system in package (SiP) in which a plurality of chips are mounted on a package substrate such as a lead frame. Further, the system SYS may be configured in a form of a chip on chip (CoC) or a package on package (PoP).

For example, the SoP includes a CPU as a controller, the semiconductor memory MEM, the ROM, the RAM, and the peripheral circuit I/O illustrated in FIG. 1. The CPU, the semiconductor memory MEM, the ROM, the RAM, and the peripheral circuit I/O are coupled to one another by a system bus SBUS. A memory controller may be arranged between the CPU and the semiconductor memory MEM.

The CPU accesses the semiconductor memory MEM, the ROM, the RAM, and the peripheral circuit I/O and controls the operation of the entire system. The semiconductor memory MEM executes the readout operation, the program operation, and the erasing operation according to an access request from the CPU. A minimum configuration of the system SYS is the CPU and the semiconductor memory MEM.

Figure 8:
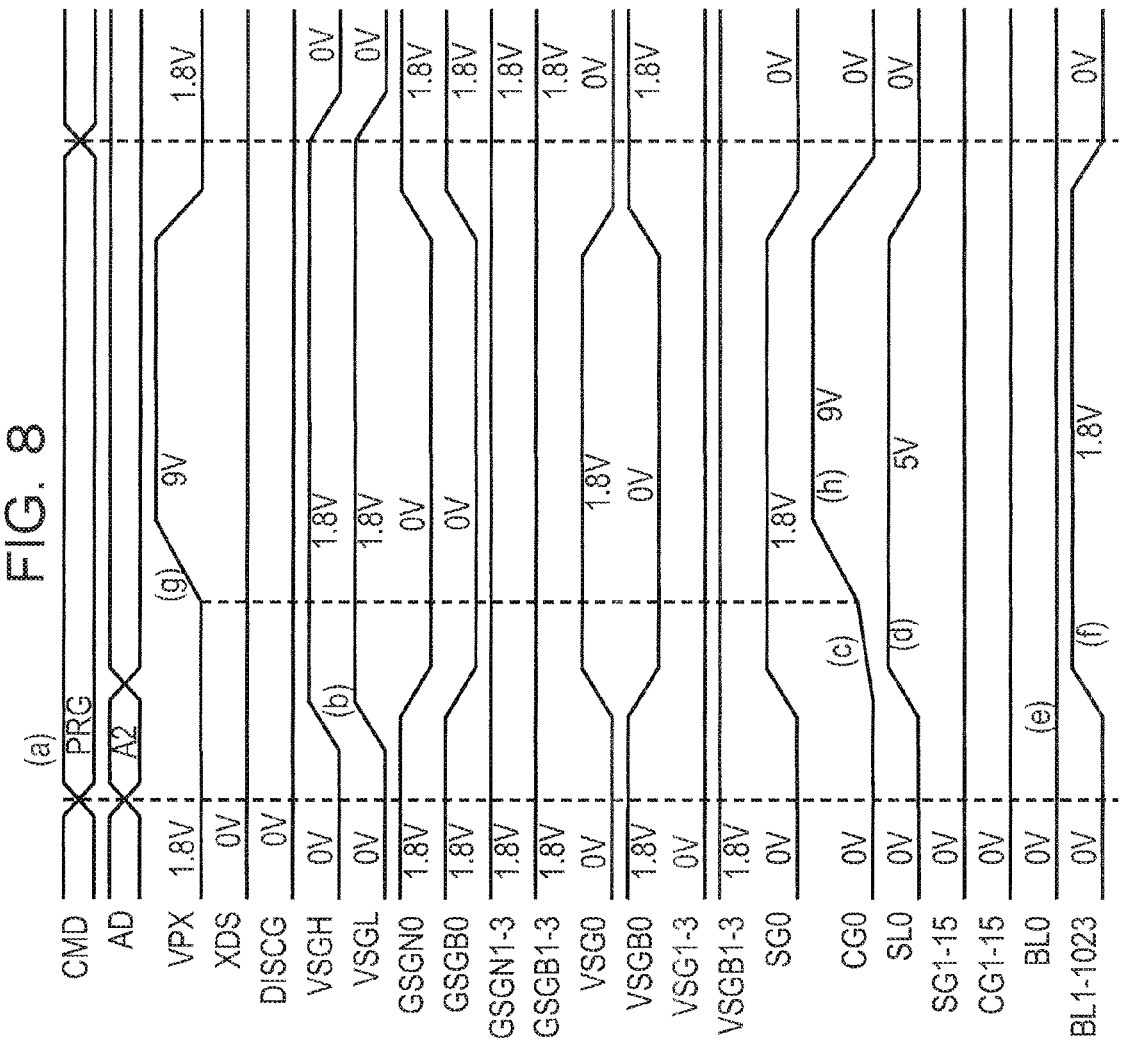
FIG. 8 illustrates an example of program operation illustrated in FIG. 6.
Figure 9:
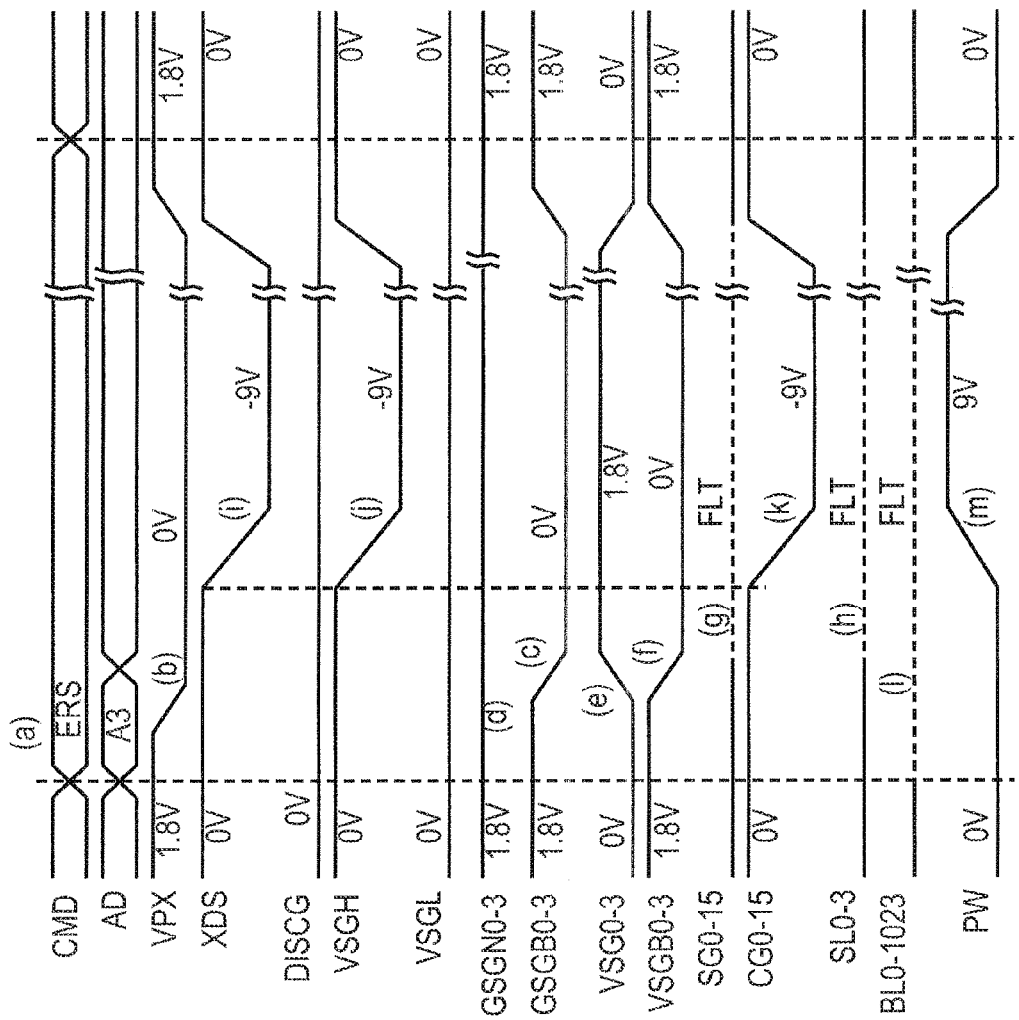
FIG. 9 illustrates an example of erasing operation illustrated in FIG. 6.

FIG. 6 illustrates an example of voltages of signal lines applied when the semiconductor memory MEM illustrated in FIG. 1 operates. In this example, in readout operation RD, data is read out from the memory cells MC coupled to the control gate line CG0 and the bit line BL0 of the sector SEC0. In program operation PRG, logic 0 is written in the memory cells MC coupled to the control gate line CG0 and the bit line BL0 of the sector SEC0. In erasing operation ERS, logic 1 is written in all the memory cells MC in the sector SEC0. Details of the operations are illustrated in FIGS. 7 to 9.

In the readout operation and the program operation, only the control gate line CG0 coupled to the memory cell MC to be accessed is set to, for example, 1.8 V or 9 V. It is possible to reduce disturbance of the memory cells MC by reducing frequency of application of a high level to the gates CG of the cell transistors CT.

Figure 7:
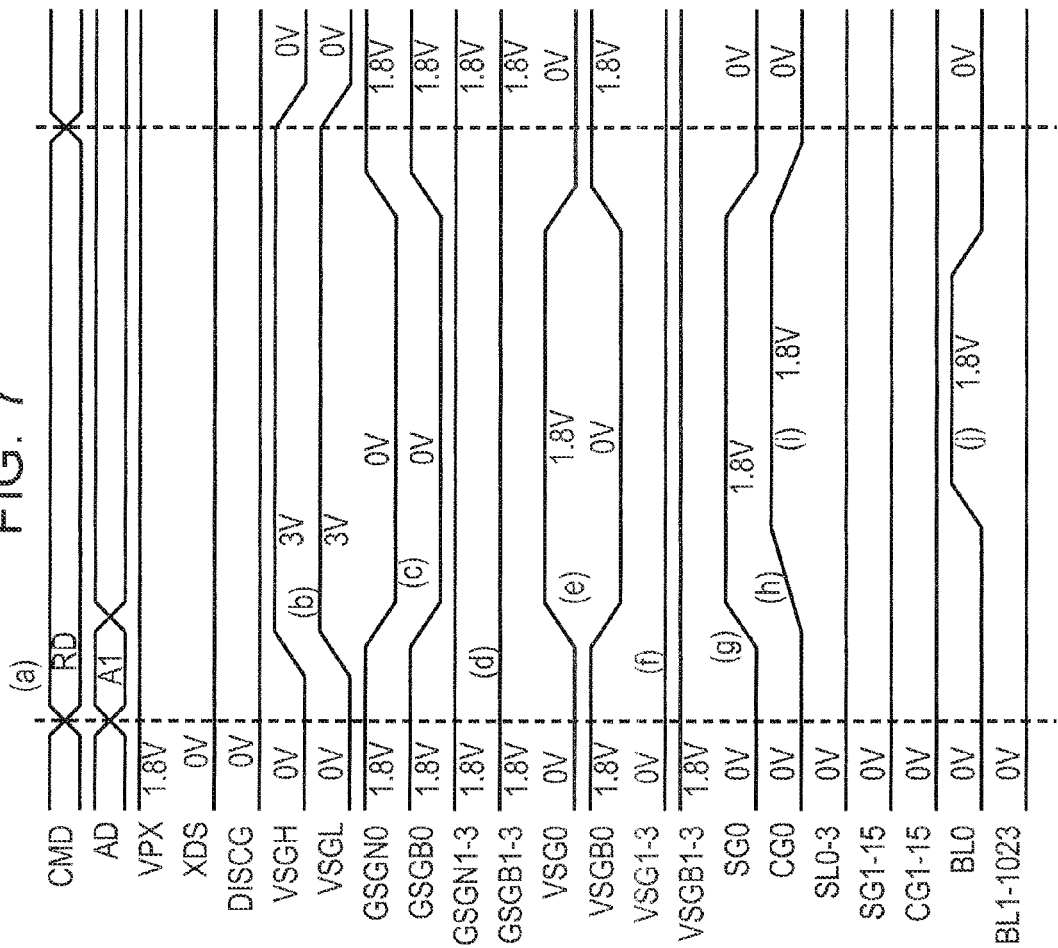
FIG. 7 illustrates an example of readout operation illustrated in FIG. 6.

FIG. 7 illustrates an example of the readout operation illustrated in FIG. 6. Unless specifically note otherwise, the operation of the sector SEC0 is explained. Although the clock signal CLK is not expressly illustrated in FIG. 6, the semiconductor memory MEM operates synchronously with the clock signal CLK.

As illustrated in (a) of FIG. 7, a readout command RD and a readout address A1 are supplied to a command terminal CMD and an address terminal AD. The readout address A1 indicates the memory cell MC from which data is read out. The internal voltage selectors VSGSELL and VSGSELH illustrated in FIG. 3 set the voltage lines VSGL and VSGH to the internal voltage HV3 as illustrated in (b) of FIG. 7 in response to the readout command RD. Consequently, all the switch circuits TRSW0 to TRSW15 in the sector SEC0 are turned on. It is desirable to set high-level voltage of the voltage lines VSGL and VSGH to be substantially equal to or higher than voltage obtained by adding threshold voltage of the transistors N3 and N4, for example, 0.5 V to high-level voltage of the selection gate line SG0, for example, 1.8 V. Consequently, a value of the high-level voltage supplied to the selection gate line SG0, for example, 1.8 V may be surely transmitted to the control gate line CG0. However, in this aspect, as further discussed below, if the voltage of the control gate line CG0 is substantially equal to or higher than the threshold voltage of the transistor N1, for example, 0.5 V, the semiconductor memory MEM operates normally.

As illustrated in (c) of FIG. 7, the word decoder XDEC0 sets the row decode signals GSGN0 and GSGB0 to low-level 0 V in response to the address signal A1. As illustrated in (d) of FIG. 7, the other row decode signals GSGN1 to GSGN3 and GSGB1 to GSGB3 are maintained at the high level, for example, 1.8 V. As illustrated in (e) of FIG. 7, the word decoder VXDEC0 sets the row decode signals VSG0 and VSGB0 to the high level, for example, 1.8 V and the low level, for example, 0 V, respectively, in response to the address signal A1. As illustrated in (f) of FIG. 7, the other row decode signals VSG1 to VSG3 and VSGB1 to VSGB3 are maintained at the low level, for example, 0 V and the high level, for example, 1.8 V.

As illustrated in (g) of FIG. 7, the selection gate driver SGDRV0 outputs the high level, for example, 1.8 V to the selection gate line SG0 in response to the low-level row decode signal GSGN0 and the high-level row decode signal VSG0. In other words, the selection gate line SG0 is driven. Since the switch circuit TRSW0 is on, the high level of the selection gate line SG0 is transmitted to the control gate line CG0. Consequently, the voltage of the control gate line CG0 rises synchronously with the voltage rise of the selection gate line SG0. The transistors N3 and N4 of the switch circuit TRSW0 have a high withstanding voltage and low operating speed. Since the control gate line CG0 is coupled to gates of the cell transistors CT, a load of the control gate line CG0 is large. Therefore, as illustrated in (h) of FIG. 7, the voltage of the control gate line CG0 gently rises compared with the voltage of the selection gate line SG0.

When the voltage of the control gate line CG0 exceeds the threshold voltage of the transistor N1 illustrated in FIG. 4, for example, 0.5 V, the transistor N1 is turned on and the gate of the transistor P2 is applied with the low level. The transistor P2 is turned on and the voltage of the control gate line CG0 rises to the voltage of the voltage line VPX, for example, 1.8 V as illustrated in (i) of FIG. 7. Specifically, the voltage of the control gate line CG0 is driven by the selection gate driver SGDRV0 and rises at the start of the readout operation and, thereafter, is set to the high level, for example, 1.8 V by the selection gate driver SGDRV0 and the level converting circuit LVLC0. Consequently, the cell transistors CT may be driven synchronously with driving timing of the selection transistor ST. In other words, readout access time may be reduced since the voltage of the control gate line CG0 may be increased before the converting operation of the level converting circuit LVLC0.

As illustrated in (j) of FIG. 7, only the bit line BL0 coupled to the memory cell MC to be accessed is set to the high level, for example, 1.8 V. Logic kept in the memory cell MC to be accessed is determined according to an amount of an electric current flowing between the bit line BL0 and the source line SL0. Specifically, when electrons have accumulated in the floating gates, the threshold voltage of the cell transistors CT is high and a memory cell current does not flow to the bit line BL0. When electrons have not accumulated in the floating gates, the threshold voltage of the cell transistors CT is low and the memory cell current flows to the bit line BL0. For example, when the memory cell current does not flow, the low level (logic 0) is output to the data terminal DQ. When the memory cell current flows, the high level (logic 1) is output to the data terminal DQ. Thereafter, the voltages of the signal lines are reset to an initial state and the readout operation ends.

The voltages of the signal lines of the sectors SEC1 to SEC3 not to be accessed are the same as, for example, the voltages of the signal lines (VSG1, SGB1, SG4 to SG7, CG4 to CG7, and SL1) of the sub-blocks SBLK1. The row decode signals GSGN0 to GSGN3 and GSGB0 to GSGB3 of the sectors SEC1 to SEC3 are set to the high level, for example, 1.8 V. The voltage lines VPX of the sectors SEC1 to SEC3 are set to the high level, for example, 1.8 V. The voltage lines XDS, DISCG, VSGH, and VSGL and the bit lines BL0 to BL1023 are set to the low level, for example, 0 V.

FIG. 8 illustrates an example of the program operation illustrated in FIG. 6. Repetitious explanation of operation similar to those described in FIG. 7 is omitted. In the program operation, waveforms of the voltage line VPX, the voltage lines VSGL and VSGH, and the control gate line CG0, the source line SL0, and the bit lines BL0 to BL1023 coupled to the memory cell MC to be accessed are different from those of the readout operation illustrated in FIG. 7. Unless specifically noted otherwise, the operation of the sector SEC0 is explained. Although the clock signal CLK is not expressly illustrated in the figure, the semiconductor memory MEM operates synchronously with the clock signal CLK. Program operation time is longer than readout operation time.

As illustrated in (a) of FIG. 8, a program command PRG and a program address A2 are supplied to the command terminal CMD and the address terminal AD. The program address A2 indicates the memory cell MC to be programmed. The internal voltage selectors VSGSELL and VSGSELH, illustrated in FIG. 3, set the voltage lines VSGL and VSGH to the power supply voltage VCC, for example, 1.8 V, as illustrated in (b) of FIG. 8, in response to the program command PRG. Consequently, the switch circuit TRSW0 is turned on. As illustrated in (c) of FIG. 8, according to the turn-on of the switch circuit TRSW0, the high level of the selection gate line SG0 is transmitted to the control gate line CG. However, since gate voltage of the transistors N3 and N4 of the switch circuit TRSW0 is 1.8 V, the voltage of the control gate line CG0 rises to, for example, 1.3 V. 1.3 V is a value lower than the voltage of the selection gate line SG0 by the threshold voltage of the transistors N3 and N4, for example, 0.5 V.

As illustrated in (d) of FIG. 8, the internal voltage selector SLSEL0 corresponding to the source line SL0 coupled to the memory cell MC to be programmed outputs the internal voltage HV5, for example, 5 V to the source line SL0 in response to the program command PRG. The source lines SL1 to SL3 are maintained at 0 V. As illustrated in (e) of FIG. 8, the bit line BL0 coupled to the memory cell MC to be programmed is maintained at 0 V. As illustrated in (f) of FIG. 8, the other bit lines BL1 to BL1023 are set to, for example, 1.8 V in response to the program command PRG.

The voltage generator HVGEN9, illustrated in FIG. 2, starts pump operation and generates the internal voltage HV9, for example, 9 V in response to the program command PRG. The internal voltage selector VPXSEL illustrated in FIG. 3 couples the voltage line VPX to the internal voltage line HV9 in response to the program command PRG. Consequently, as illustrated in (g) of FIG. 8, the voltage of the voltage line VPX rises to 9 V as the pump operates. When the voltage of the control gate line CG0 exceeds the threshold voltage of the transistor N1, illustrated in FIG. 4, for example, 0.5 V, the transistors N1 and P2 are sequentially turned on. At this point, since the voltage of the voltage line VPX rises from the 1.8 V to 9 V, as illustrated in (h) of FIG. 8, the voltage of the control gate line CG0 rises to 9 V according to a change of the voltage VPX. Consequently, the cell transistors CT are turned on.

At this point, the gates of the transistors N3 and N4 of the switch circuit TRSW0 are applied with 1.8 V (VSGL and VSGH). Therefore, the high voltage of the control gate line CG0, for example, 9 V may be prevented from being transmitted to the selection gate line SG0 via the switch circuit TRSW0. In other words, when the control gate line CG0 is set to the high voltage, for example, 9 V, it is also unnecessary to change the gate voltage of the transistors N3 and N4. The gate voltage of the transistors N3 and N4 are set to be substantially equal to or lower than voltage obtained by adding the threshold voltage of the transistors N3 and N4 to the voltage of the selection gate line SG0, for example, 1.8 V.

The selection transistor ST of the memory cell MC to be programmed is turned on by the high-level selection gate line SG0. Therefore, an electric current flows from the source line SL0 to the bit line BL0 and a hot electron is generated in a channel region of the cell transistor CT to be programmed. The hot electron is injected into the floating gate of the cell transistor CT and accumulated by the high-level voltage of the control gate line CG0, for example, 9 V. The threshold voltage of the cell transistor CT rises. In other words, logic 0 is written in the memory cell MC. Thereafter, the voltages of the signal line are reset to the initial state and the program operation is completed.

The voltages of the signal lines of the sectors SEC1 to SEC3 not to be accessed are the same as, for example, the voltages of the signal lines (VSG1, VSGB1, SG4 to SG7, CG4 to CG7, and SL1) of the sub-block SBLK1. The row decode signals GSGN0 to GSGN3 and GSGB0 to GSGB3 of the sectors SEC1 to SEC3 are set to the high level, for example, 1.8 V. The voltage lines VPX of the sectors SEC1 to SEC3 are set to the high level, for example, 1.8 V and the voltage lines XDS, DISCG, VSGH, and VSGL and the bit lines BL0 to BL1023 are set to the low level, for example, 0 V.

FIG. 9 illustrates an example of the erasing operation illustrated in FIG. 6. Detailed explanation of operation same as that illustrated in FIG. 7 is omitted. The erasing operation is executed for each of the sectors SEC. Logic 1 is set in all the memory cells MC in the selected sector SEC. In this example, the erasing operation of the sector SEC0 is explained. Although the clock signal CLK is not expressly illustrated in the figure, the semiconductor memory MEM operates synchronously with the clock signal CLK.

As illustrated in (a) of FIG. 9, an erasing command ERS and an erasing address A3 are supplied to the command terminal CMD and the address terminal AD. The erasing address A3 indicates the sector SEC to be erased. The internal voltage selector VPXSEL, illustrated in FIG. 3, couples the voltage line VPX to the ground line GND in response to the erasing command ERS. Consequently, as illustrated in (b) of FIG. 9, the voltage line VPX is set to 0 V, the level converting circuits LVLC0 to LVLC15 in the sector SEC0 are inactivated and stop the level converting operation.

As illustrated in (c) of FIG. 9, the word decoders XDEC0 to XDEC3 set the row decode signals GSGB0 to GSGB3 in the sector SEC0 to the low level, for example, 0 V in response to the erasing command ERS and the erasing address A3. As illustrated in (d) of FIG. 9, the row decode signals GSGN0 to GSGB3 in the sector SEC0 are maintained at the high level, for example, 1.8 V. As illustrated in (e) and (f) of FIG. 9, the word decoder VXDEC0 sets the row decode signals VSG0 to VSG3 to the high level, for example, 1.8 V and sets the row decode signals VSGB0 to VSGB3 to the low level, for example, 0 V in response to the erasing command ERS and the erasing address A3. Consequently, as illustrated in (g) of FIG. 9, the selection gate lines SG0 to SG15 in the sector SEC0 change to a floating state FLT. As illustrated in (h) of FIG. 9, when the internal voltage selectors SLSEL0 to SLSEL3 in the sector SEC0 stop the voltage output operation, the source lines SL0 to SL3 also change to the floating state FLT.

The voltage generator NVGEN9, illustrated in FIG. 2, starts the pump operation in response to the erasing command ERS and generates the internal voltage NV9, for example, −9 V. The internal voltage selector XDSSEL, illustrated in FIG. 3, couples the voltage line XDS to the internal voltage line NV9 in response to the erasing command ERS. As illustrated in (i) of FIG. 9, the voltage of the voltage line XDS falls to −9 V as the pump operates. Similarly, the internal voltage selector VSGSELH couples the voltage line VSGH to the internal voltage line NV9 in response to the erasing command ERS. Consequently, as illustrated in (j) of FIG. 9, the voltage line VSGH falls to −9 V as the pump operates. The transistors N3 of the switch circuits TRSW0 to TRSW15 in the sector SEC0, illustrated in FIG. 4, are applied with −9 V of the voltage line VSGH and turned off. The transistors N4 are applied with 0 V of the voltage line VSGL and turned off.

The transistors N2 of the level converting circuits LVLC0 to LVLC15 in the sector SEC0 receive the voltage of the voltage line DISCG, for example, 0 V in gates and receive the voltage of the voltage line XDS in sources. The transistors N2 are turned on when a gate to source voltage thereof rises to be greater than the threshold voltage of the transistors N2, for example, 0.5 V. In other words, when the voltage of the voltage line XDS falls to be less than −0.5 V, the transistors N2 are turned on. Consequently, as illustrated in (k) of FIG. 9, the voltage of the control gate lines CG0 to CG15 in the sector SEC0 falls to −9 V according to a change of the voltage of the voltage line XDS.

The selection gate line SG0 to SG15 in the floating state are charged to positive voltage according to a coupling phenomenon when 9 V is applied to a p-type well. Consequently, it is likely that voltage substantially equal to or higher than 10 V is applied to both the ends of the switch circuits TRSW0 to TRSW15. However, as explained above, since both the transistors N3 and N4 are off, voltage exceeding the withstanding voltage may be prevented from being applied to the transistors N3 and N4.

As illustrated in (i) of FIG. 9, the bit lines BL0 to BL1023 are set in the floating state FLT when the sector switch SSW or the column switch YSW is turned off. The operation of the sector switch SSW and the column switch YSW is controlled by the operation control circuit 14.

The voltage generator HVGEN9, illustrated in FIG. 2, starts the pump operation in response to the erasing command ERS and generates the internal voltage HV9, for example, 9 V. The internal voltage selector WELSEL, illustrated in FIG. 3, couples the voltage line PW to the internal voltage line HV9 in response to the erasing command ERS. Consequently, as illustrated in (m) of FIG. 9, the voltage of the voltage line PW rises to 9 V as the pump operates. In other words, the well regions PWEL of the cell transistors CT of all the memory cells MC of the sector SEC0 are set to 9 V.

The cell transistors CT of all the memory cells MC of the sector SEC0 are applied with negative voltage in gates. The well regions PWEL is set to a high voltage. Consequently, electrons trapped in the floating gates of the cell transistors CT are emitted to the well regions PWEL and the threshold voltage of the memory cells MC falls. In other words, data stored in all the memory cells MC of the sector SEC0 is set to logic 1. Thereafter, the voltages of the signal lines are reset to the initial state and the erasing operation is completed.

In the sectors SEC1 to SEC3 not accessed, the row decode signals GSGN0 to GSGN3, GSGB0 to GSGB3, and VSGH0 to VSGH3 are set to the high level, for example, 1.8 V and the row decode signals VSGB0 to VSGB3 are set to the low level, for example, 0 V. The voltage line VPX is set to the high level, for example, 1.8 V and the voltage lines XDS, DISCG, VSGH, VSGL, and PW are set to the low level, for example, 0 V. The control gate lines CG0 to CG15, the selection gate lines SG0 to SG1, and the source lines SL0 to SL3 are set in the floating state FLT.

As explained above, in this aspect, in the readout operation and the program operation, the control gate lines CG are coupled to the selection gate lines SG via the switch circuits TRSW. Consequently, the cell transistors CT may be driven by using the high-level voltage supplied to the selection gate lines SG. In other words, the selection gate lines SG and the control gate lines CG may be simultaneously driven by using the selection gate drivers SGDRV. The cell transistors CT may be driven synchronously with driving timing of the selection transistor ST. As a result, the cell transistors CT may be quickly driven without increasing a chip size of the semiconductor memory MEM. Further, readout time and writing time for the semiconductor memory MEM may be reduced. In particular, in the readout operation that does not require a high voltage, the cell transistors (CT) may be quickly driven.

Figure 10:
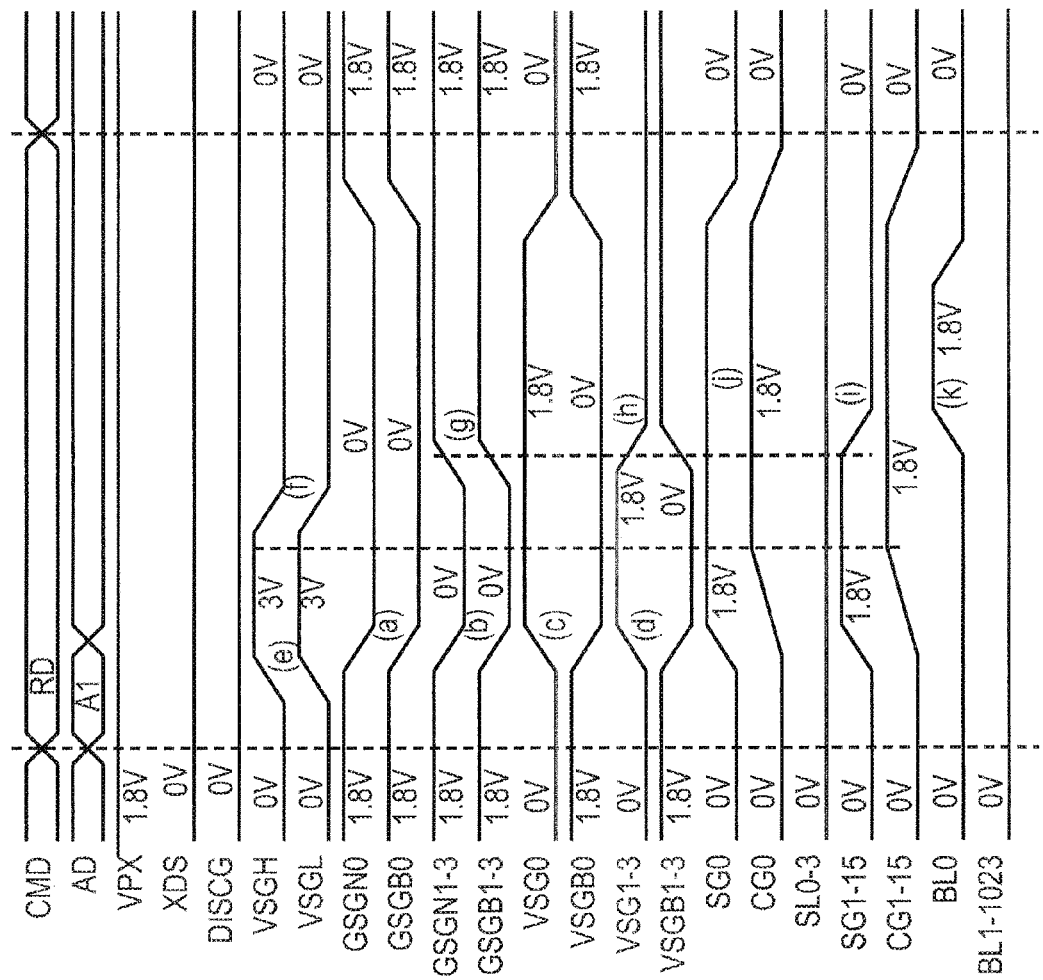
FIG. 10 illustrates an example of readout operation for a semiconductor memory according to another aspect of the present invention.

FIG. 10 illustrates an example of readout operation for a semiconductor memory according to another aspect of the present invention. Components same as those explained in the aspect are denoted by the same reference numerals and signs and detailed explanation of the components is omitted. The semiconductor memory MEM is the same as that illustrated in FIG. 1 except that timing of a control signal output by the operation control circuit 14 during the readout operation is different. For example, the semiconductor memory MEM is a flash memory of a NOR type. The semiconductor memory MEM operates synchronously with the clock signal CLK but may operate asynchronously with the clock signal CLK. The semiconductor memory MEM may be designed as a memory macro mounted on a system LSI or the like or may be designed as a semiconductor storage device encapsulated in a package. For example, the semiconductor memory MEM is mounted on the system SYS illustrated in FIG. 5. The program operation and the erasing operation are the same as those illustrated in FIGS. 8 and 9.

In the readout operation in this example, the memory cells MC of the sub-block SBLK0 in the sector SEC0 are accessed according to the address signal A1. In this aspect, in (a) and (b) of FIG. 10, all the row decode signals GSGN0 to GSGN3 and GSGB0 to GSGB3 in all the sectors SEC0 to SEC3 are set to the low level, for example, 0 V in response to the readout command RD. In (c) and (d) of FIG. 10, all the row decode signals VSG0 to VSG3 in all the sectors SEC0 to SEC3 are set to the high level, for example, 1.8 V and all the row decode signals VSGB0 to VSGB3 are set to the low level, for example, 0 V.

In (e) of FIG. 10, the voltage lines VSGL and VSGH in all the sectors SEC0 to SEC3 are set to the high level, for example, 3 V. Consequently, all the selection gate lines SG0 to SG15 and all the control gate lines CG0 to CG15 in the sectors SEC0 to SEC3 are set to the high level, for example, 1.8 V. Specifically, the voltage of the control gate lines CG0 to CG15 rises according to a voltage change of the selection gate lines SG0 to SG15 via the switch circuits TRSW0 to TRSW15. Thereafter, the level converting circuits LVLC0 to LVLC15 operate and the voltage of the control gate lines CG0 to CG15 is set to the voltage of the voltage line VPX, for example, 1.8 V. Since the bit lines BL0 to BL1023 and the source lines SL0 to SL3 are set to the low level, for example, 0 V, no electric current flows to the memory cells MC at this point.

In (f) of FIG. 10, the voltage lines VSGL and VSGH in all the sectors SEC0 to SEC3 are set to the low level, for example, 0 V. Consequently, the switch circuits TRSW0 to TRSW15 of all the sectors SEC0 to SEC3 are turned off and the control gate lines CG0 to CG15 are separated from the selection gate lines SG0 to SG15. Thereafter, all the control gate lines CG0 to CG15 of all the sectors SEC0 to SEC3 are maintained at 1.8 V irrespective of a voltage level of the selection gate lines SG0 to SG15.

In (g) of FIG. 10, the row decode signals GSGN1 to GSGN3 and GSGB1 to GSGB3 not corresponding to the memory cell MC to be accessed are set to the high level, for example, 1.8 V. Similarly, in (h) of FIG. 10, the row decode signal VSG1 to VSG3 and VSGB1 to VSGB3 not corresponding to the memory cell MC to be accessed are respectively set to the low level, for example, 0 V and the high level, for example, 1.8 V. Consequently, in the selection gate drivers SGDRV1 to SGDRV15 corresponding to the memory cells MC not to be accessed, at least one of the transistors N5 and N6 is turned on. In (i) of FIG. 10, the selection gate lines SG1 to SG15 coupled to the memory cells MC not to be accessed change to the low level, for example, 0 V. In (j) of FIG. 10, only the selection gate line SG0 coupled to the memory cell MC to be accessed is maintained at the high level, for example, 1.8 V.

Thereafter, in (k) of FIG. 10, as in FIG. 7, only the bit line BL0 coupled to the memory cell MC to be accessed is set to the high level, for example, 1.8 V. Logic kept in the memory cell MC to be accessed is determined according to an amount of an electric current flowing between the bit line BL0 and the source line SL0.

Figure 11:
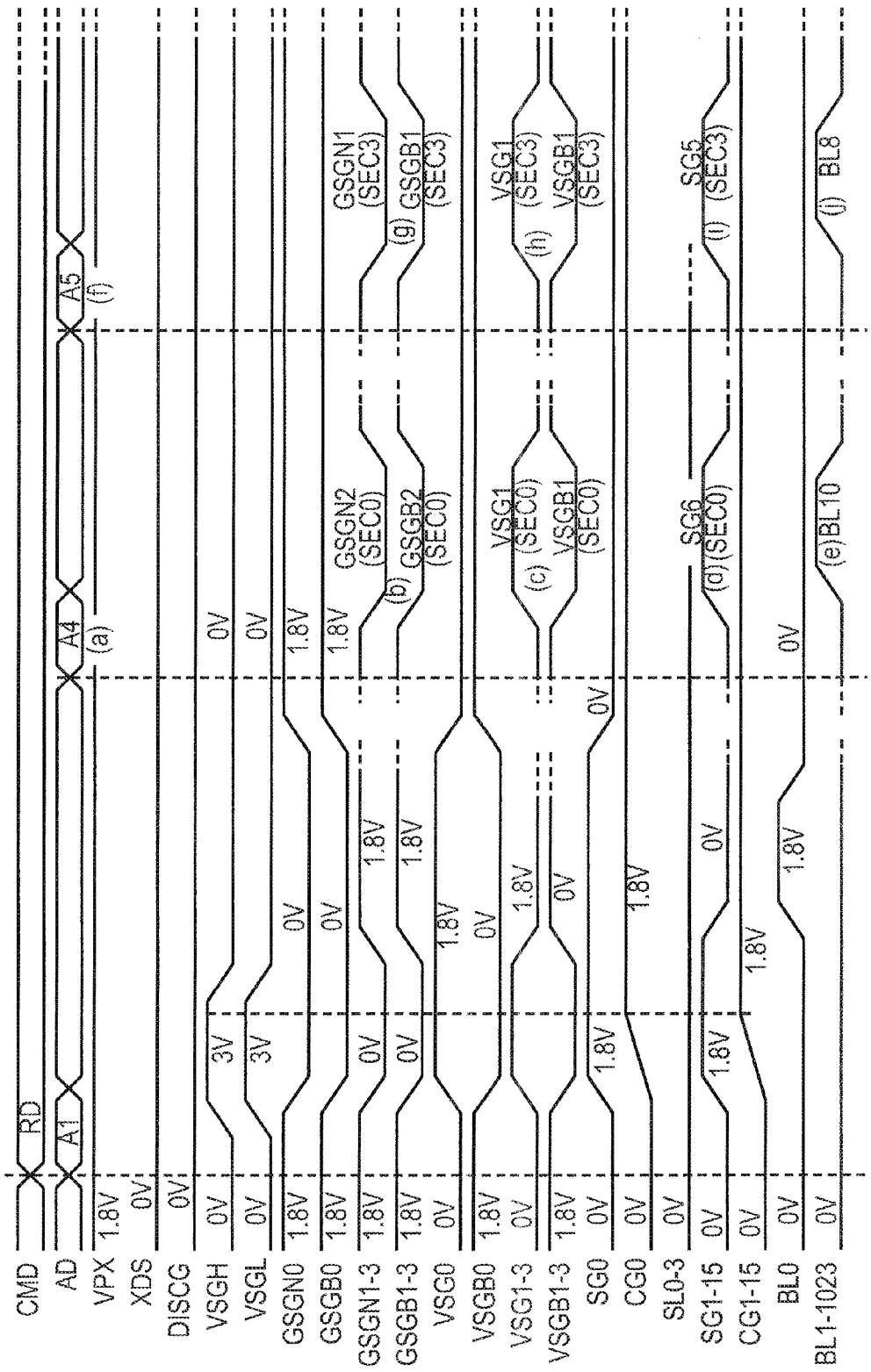
FIG. 11 illustrates another example of the readout operation illustrated in FIG. 10.

FIG. 11 illustrates another example of the readout operation illustrated in FIG. 10. In this example, in order to sequentially switching only the selection gate lines SG, address signals AD (row address signals) are sequentially supplied and the readout operation is continuously executed. Detailed explanation of operation same as that illustrated in FIG. 10 is omitted.

The readout operation for the sector SEC0 according to the address signal A1 supplied together with the readout command RD is the same as that illustrated in FIG. 10. In (a) of FIG. 11, after first readout operation, the next address signal A4 is supplied. For example, the address signal A4 is supplied synchronously with the clock signal CLK a certain number of clock cycles after the readout command RD. The operation control circuit 14 continues the readout operation when the next address signal AD is supplied within the certain number of clock cycles. For example, the readout operation is continued according to the address signals AD continuously supplied to the semiconductor memory MEM when the chip enable signal /CE is activated at the low level. In this example, the address signal A4 indicates the memory cell MC coupled to the control gate line CG6 (SBLK1) and the bit line BL 10 of the sector SEC0.

In (b) of FIG. 11, the low decode signals GSGN2 and GSGB2 corresponding to the memory cell MC to be accessed are set to the low level according to the address signal A4. Similarly, in (c) of FIG. 11, the row decode signals VSG1 and VSGB1 corresponding to the memory cell MC to be accessed are respectively set to the high level and the low level. In (d) and (e) of FIG. 11, the selection gate line SG6 and the bit line BL10 coupled to the memory cell MC to be accessed changes to the high level and the readout operation is executed. In this aspect, the control gate lines CG0 to CG15 are maintained at the high level by the level converting circuit LVLC0 to LVLC15 during the first readout operation. Since it is unnecessary to drive the control gate lines CG0 to CG15 having a large load, access time of the readout operation may be reduced.

In (f) of FIG. 11, an address signal A5 is supplied to the semiconductor memory MEM. For example, the address signal A5 indicates the memory cell MC coupled to the control gate line CG5 (SBLK1) and the bit line BL8 of the sector SEC3. In (g) of FIG. 11, the row decode signals GSGN1 and GSGB1 of the sector SEC3 are set to the low level according to the address signal A5. Similarly, in (h) of FIG. 11, the row decode signals VSG1 and VSGB1 of the sector SEC3 are respectively set to the high level and the low level. In (i) and (j) of FIG. 11, the selection gate line SG5 and the bit line BL8 of the sector SEC3 changes to the high level and the readout operation is executed. Thereafter, since the address signals AD are sequentially supplied to the semiconductor memory MEM, an arbitrary memory cell MC of arbitrary sectors SEC0 to SEC3 may be randomly accessed at high speed.

As explained above, in this aspect, effects same as those of the aspect explained above may be obtained. Further, in the readout operation, after all the control gate lines CG0 to CG15 are set to the high level, the switch circuits TRSW0 to TRSW15 are turned off. Thereafter, the readout operation may be executed without driving the control gate lines CG0 to CG15 again. As a result, an arbitrary memory cell MC of arbitrary sectors SEC0 to SEC3 may be accessed at high speed and at random.

Figure 12:
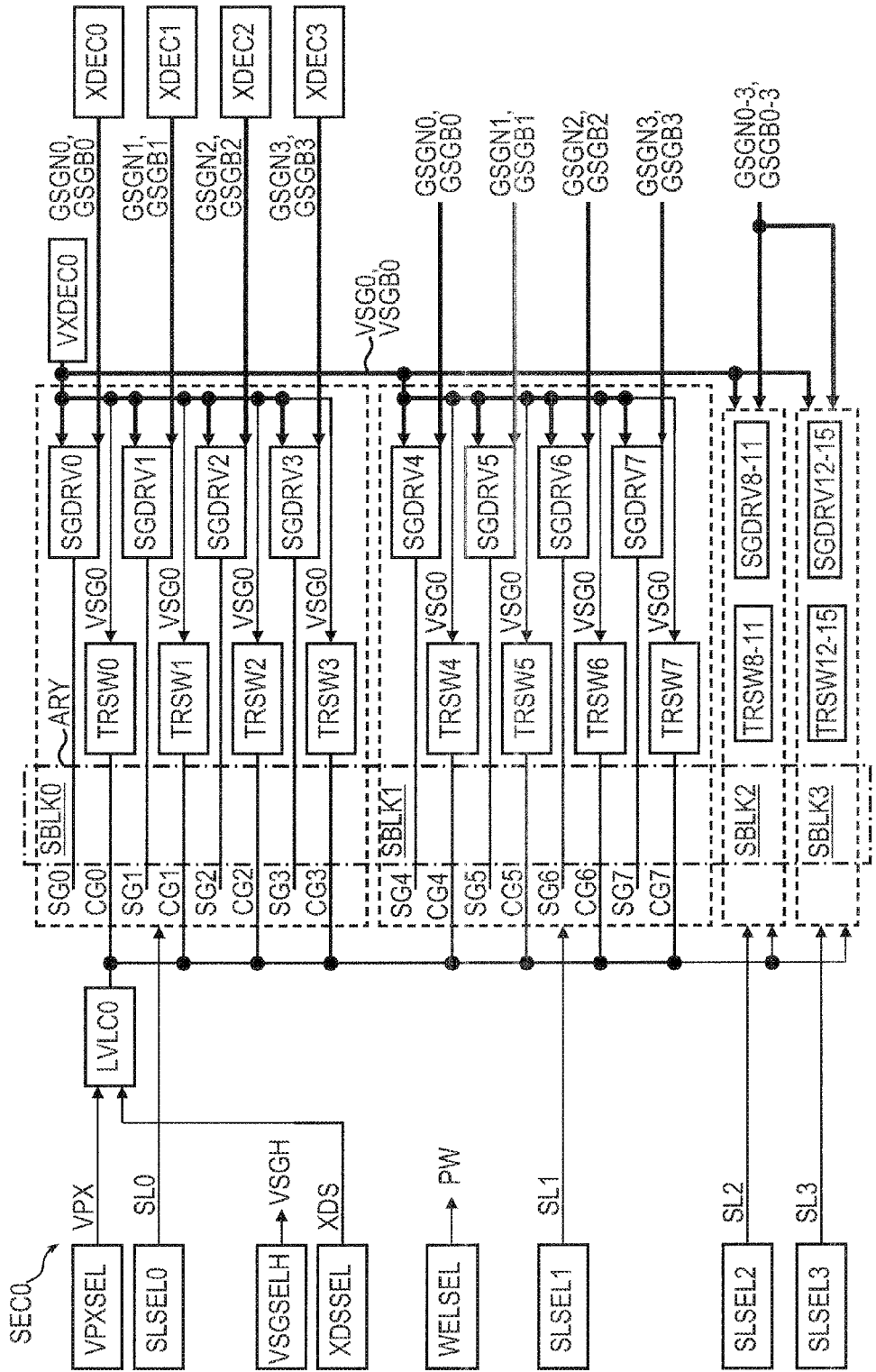
FIG. 12 illustrates an example of a sector of the semiconductor memory according to the other aspect.

FIG. 12 illustrates an example of the sector SEC0 of a semiconductor memory according to still another aspect of the present invention. Components same as those explained above in the aspects are denoted by the same reference numerals and signs and detailed explanation of the components is omitted. The semiconductor memory MEM are the same as that illustrated in FIGS. 1 and 2 except that the semiconductor memory MEM does not have the internal voltage selector VSGSELL and timing of a control signal output by the operation control circuit 14 is different. For example, the semiconductor memory MEM is a flash memory of the NOR type. The semiconductor memory MEM operates synchronously with the clock signal CLK but may operate asynchronously with the clock signal CLK. The semiconductor memory MEM may be designed as a memory macro mounted on a system LSI or the like or may be designed as a semiconductor storage device encapsulated in a package. For example, the semiconductor memory MEM is mounted on the system SYS, illustrated in FIG. 5.

A configuration of the sectors SEC1 to SEC3 is the same as that illustrated in FIG. 2. The semiconductor memory MEM includes one level converting circuit LVLC0 in each of the sectors SEC0 to SEC3. An output of the level converting circuit LVLC0 is coupled in common to sixteen control gate lines CG0 to CG15. The control gate lines CG0 to CG3 of the sub-block SBLK0 are coupled in common to the row decode signal line VSG0 via the switch circuits TRSW0 to TRSW3. Similarly, the control gate lines CG4 to CG15 of the sub-blocks SBLK1 to SBLK3 are respectively coupled to the row decode signal lines VSG1 to VSG3 via the switch circuits TRSW4 to TRSW15. Other components of the sectors SEC0 are the same as those illustrated in FIG. 3. The level converting circuit LVLC0 may be provided in each of the sub-blocks SBLK0 to SBLK3. The word decoder VXDEC0 may be provided in each of the sub-blocks SBLK0 to SBLK3. The control gate lines CG0 to CG3 may be coupled to the row decode signal line VSG0 via one switch circuit TRSW0.

Figure 13:
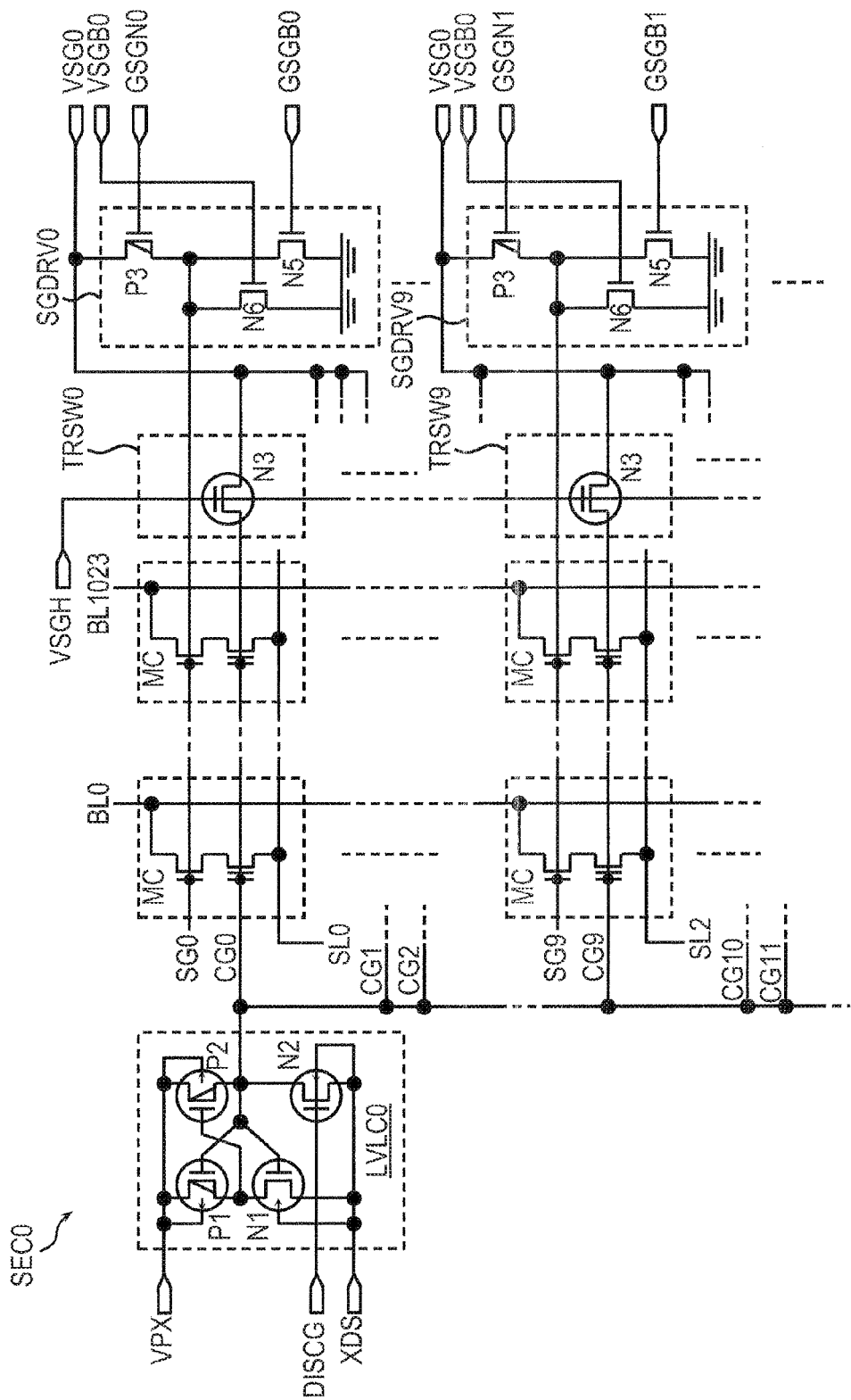
FIG. 13 illustrates a main part of the sector illustrated in FIG. 12.

FIG. 13 illustrates a part of the sector SEC0 illustrated in FIG. 12. The switch circuits TRSW (TRSW0 to TRSW15) have nMOS transistors N3 arranged between the control gate lines CG (CG0 to CG15) and the row decode signal line VSG0. In this aspect, the transistors N4, illustrated in FIG. 4, are deleted. The transistors P3 of the selection gate drivers SGDRV (SGDRV0 to SGDRV15) carry out the function of the transistors N4, illustrated in FIG. 4. As explained above, the function of the transistors N4 is to prevent voltage exceeding the withstanding voltage from being applied to the transistors during the erasing operation. Since the switch circuits TRSW0 to TRSW15 are formed by only the transistors N3, a chip size of the semiconductor memory MEM may be reduced.

Gates of the transistors N3 are coupled to the voltage line VSGH. When the voltage line VSGH coupled to the gates of the transistors N3 are at the high level, the control gate lines CG0 to CG15 are coupled to any one of the row decode signal lines VSG0 to VSG3. The selection gate drivers SGDRV0 to SGDRV3 and the selection gate lines SG0 to SG15 are the same as those illustrated in FIGS. 3 and 4.

FIG. 14 illustrates an example of voltages of signal lines applied when the semiconductor memory MEM illustrated in FIG. 12 operates. In this example, in the readout operation (RD), when the control gate line CG0 of the sector SEC0 is set to the high level, for example, 1.8 V. the other control gate lines CG1 to CG15 in the sector SEC0 are also set to the high level, for example, 1.8 V. Similarly, in the program operation (PRG), when the control gate line CG0 of the sector SEC0 is set to the high level, for example, 9 V, the other control gate lines CG1 to CG15 in the sector SEC0 are also set to the high level, for example, 9 V. The other voltages are the same as those illustrated in FIG. 6.

Figure 15:
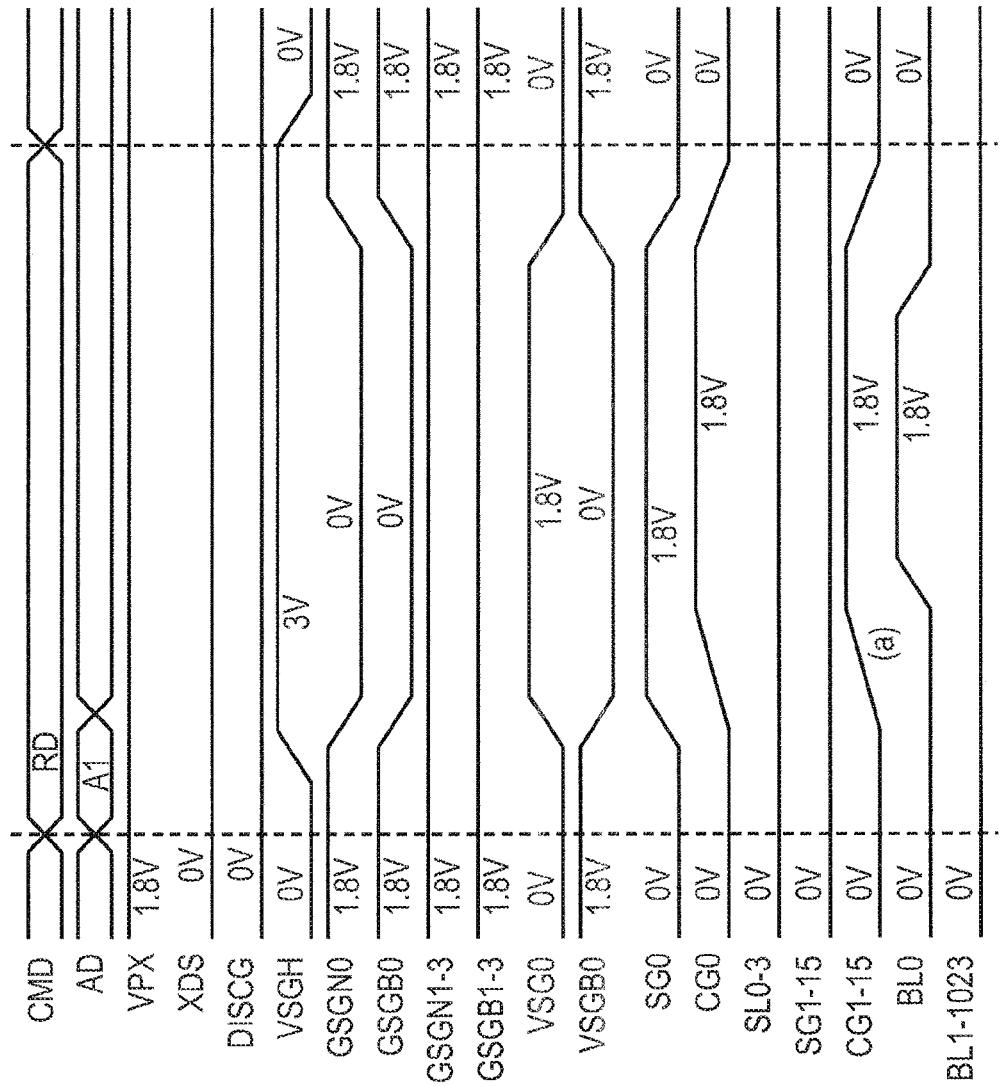
FIG. 15 illustrates an example of readout operation illustrated in FIG. 14.

FIG. 15 illustrates an example of the readout operation illustrated in FIG. 14. Detailed explanation of operation same as that illustrated in FIG. 7 is omitted. In this aspect, in (a) of FIG. 15, when the memory cells MC coupled to the selection gate line SG0 are accessed, not only the control gate line CG0 but also the control gate lines CG1 to CG15 change to the high level, for example, 1.8 V. Other operation is the same as that illustrated in FIG. 7 except that the voltage line VSGL is not present. When the voltage line VSGH is set to the high level and the row decode signals GSGN0 and GSGB0 are set to the low level, the transistors N3 and P3 illustrated in FIG. 13 are turned on. Consequently, the control gate line CG0 is coupled to the selection gate line SG0 via the transistors N3 and P3. In other words, the control gate line CG0 is coupled to the selection gate line SG0 by the switch circuit TRSW0 via the selection gate driver SGDRV0.

Even if the control gate lines CG1 to CG15 not involved in access change to the high level, the selection gate lines SG1 to SG15 are at the low level. Therefore, a memory cell current does not flow to the memory cells MC except the memory cell MC for which the readout operation is executed and so semiconductor memory MEM does not malfunction. For example, the control gate line CG0 is coupled to the row decode signal line VSG0 via only the transistor N3. Since a load coupled to the control gate line CG0 may be reduced, a voltage change of the row decode signal line VSG0 may be quickly transmitted to the control gate line CG0. As a result, it is possible to reduce readout access time without increasing a chip size of the semiconductor memory MEM.

Figure 16:
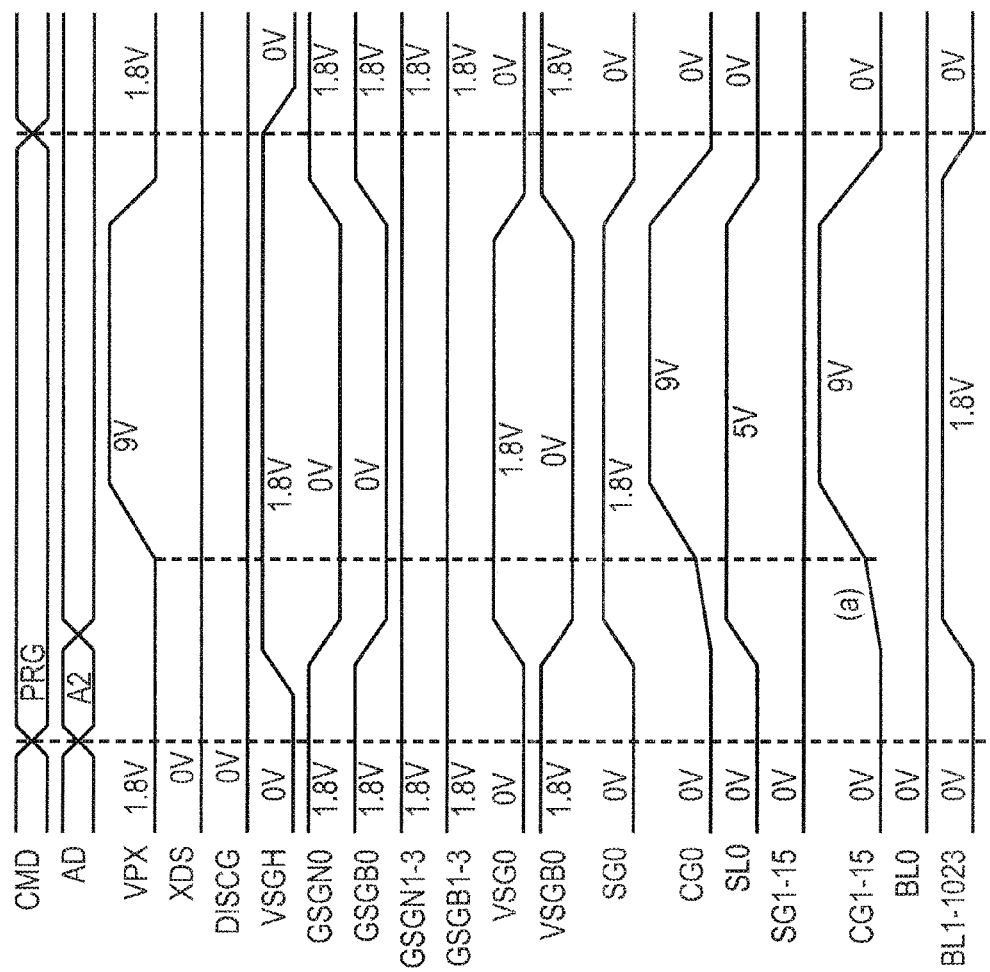
FIG. 16 illustrates an example of program operation illustrated in FIG. 14.

FIG. 16 illustrates an example of the program operation illustrated in FIG. 14. Detailed explanation of operation same as that illustrated in FIG. 8 is omitted. In this aspect, in (a) of FIG. 16, when the memory cell MC coupled to the selection gate line SG0 is accessed, not only the control gate line CG0 but also the control gate lines CG1 to CG15 changes to the high level, for example, 9 V. Other operation is the same as that illustrated in FIG. 8 except that the voltage line VSGL is not present.

Even if the control gate lines CG1 to CG15 not involved in access change to the high level, the selection gate lines SG1 to SG15 are at the low level. Therefore, a memory cell current does not flow to the memory cells MC except the memory cell MC for which the program operation is executed. In other words, the memory cells MC other than the memory cell MC of interest are prevented from being programmed. Other operation is the same as that illustrated in FIG. 7 except that the voltage line VSGL is not present. Further, as in the readout operation, a voltage change of the row decode signal line VSG0 may be quickly transmitted to the control gate CG0 and program operation time may be reduced.

Figure 17:
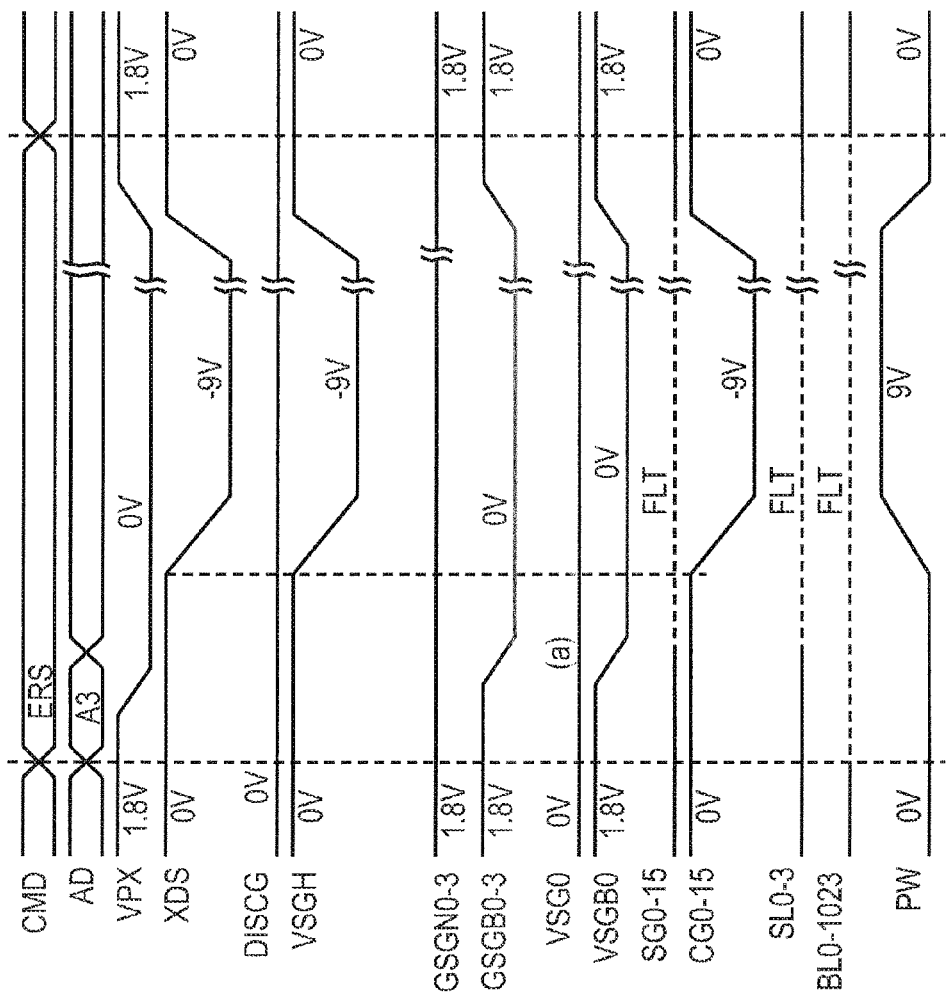
FIG. 17 illustrates an example of erasing operation illustrated in FIG. 14.

FIG. 17 illustrates an example of the erasing operation illustrated in FIG. 14. Detailed explanation of operation same as that illustrated in FIG. 9 is omitted. In this aspect, in (a) of FIG. 17, the word decoders VXDEC0 to VXDEC3 maintain the row decode signals VSG0 to VSG3 at the low level, for example, 0 V during the erasing operation. Other operation is the same as that illustrated in FIG. 9 except that the voltage line VSGL is not present.

The control gate lines CG0 to CG15 are set to −9 V. Nodes on the opposite side of the control gate lines CG0 to CG15 of the switch circuits TRSW0 to TRSW15 are coupled to the ground line GND by the word decoders VXDEC0 to VXDEC3. Consequently, voltage of 9 V is applied to both the ends of the switch circuits TRSW0 to TRSW15 illustrated in FIG. 13. However, the transistors N3 of the switch circuits TRSW0 to TRSW15 are manufactured in the CMOS process having a high withstanding voltage, for example, 10 V, and as such, the transistors N3 are not destroyed.

On the other hand, as explained above, the selection gate lines SG0 to SG15 in the floating state are charged to positive voltage, for example, 1.8 V according to the coupling phenomenon. Therefore, voltage of 2 V is applied to both the ends of the transistors P3 of the selection gate drivers SGDRV0 to SGDRV3 illustrated in FIG. 13. However, since withstanding voltage of the transistors P3 is 2 V. the transistors P3 is not destroyed. Since the nodes on the opposite sides of the control gate lines CG0 to CG15 of the switch circuits TRSW0 to TRSW15 are set to 0 V during the erasing operation, the switch circuits TRSW0 to TRSW15 may be formed by only the transistors N3. Therefore, a circuit size of the switch circuits TRSW0 to TRSW15 may be reduced.

As explained above, in this aspect, effects same as those of the aspects explained above may be obtained. Further, since the switch circuits TRSW0 to TRSW15 are formed by only the transistors N3, a chip size may be reduced and the cell transistors CT may be quickly driven. When the switch circuits TRSW0 to TRSW15 are formed by only the transistors N3, voltage substantially equal to or higher than the withstanding voltage may be prevented from being applied to the transistors N3 and P3.

Figure 18:
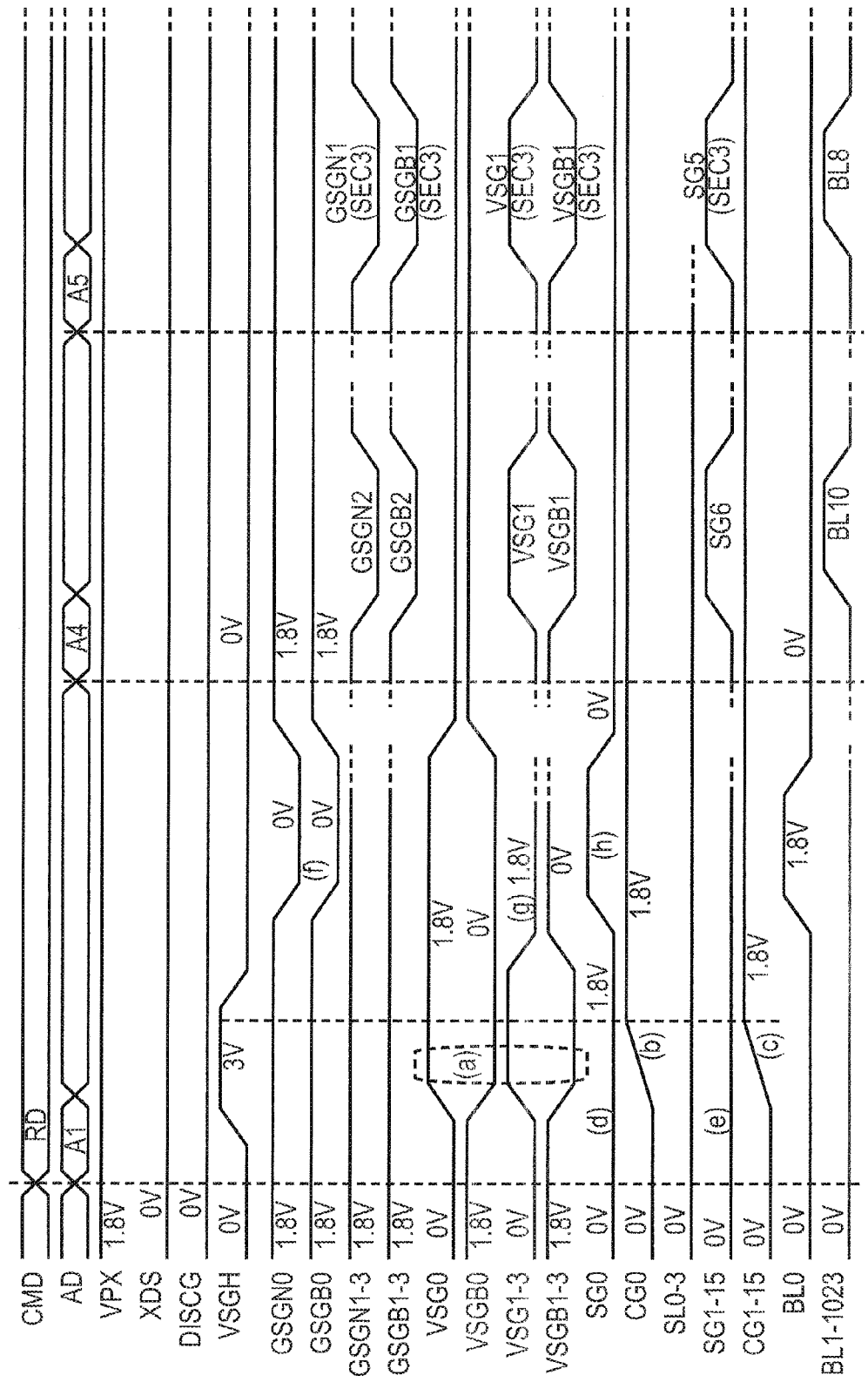
FIG. 18 illustrates an example of readout operation for a semiconductor memory according to still another aspect of the present invention.

FIG. 18 illustrates an example of readout operation for a semiconductor memory MEM according to still another aspect of the present invention. Components same as those explained above in the aspects are denoted by the same reference numerals and signs and detailed explanation of the components is omitted. The semiconductor memory MEM is the same as that illustrated in FIGS. 12 and 13 except that timing of a control signal output by the operation control circuit 14 during the readout operation is different. However, in this aspect, in FIG. 12, the word decoder VXDEC0 is formed in each of the sub-blocks SBLK0 to SBLK3. The word decoder VXDEC0 corresponding to the sub-block SBLK0 outputs the row decode signals VSG0 and VSGB0 to the sub-block SBLK0. The word decoder VXDEC0 corresponding to the sub-block SBLK1 outputs the row decode signals VSG1 and VSGB1 to the sub-block SBLK1. The word decoder VXDEC0 corresponding to the sub-block SBLK2 outputs the row decode signals VSG2 and VSGB2 to the sub-block SBLK2. The word decoder VXDEC0 corresponding to the sub-block SBLK3 outputs the row decode signals VSG3 and VSGB3 to the sub-block SBLK3.

For example, the semiconductor memory MEM is a flash memory of the NOR type. The semiconductor memory MEM operates synchronously with the clock signal CLK but may operate asynchronously with the clock signal CLK. The semiconductor memory MEM may be designed as a memory macro mounted on a system LSI or the like or may be designed as a semiconductor storage device encapsulated in a package. For example, the semiconductor memory MEM is mounted on the system SYS illustrated in FIG. 5. Program operation and erasing operation are the same as those illustrated in FIGS. 16 and 17.

In this aspect, in (a) of FIG. 18, when the switch circuits TRSW0 to TRSW15 illustrated in FIG. 13 are turned on (the voltage line VSGH=3 V), the row decode signals VSG0 to VSG3 are set to the high level, for example, 1.8 V and the row decode signals VSGB0 to VSGB3 are set to the low level, for example, 0 V. Consequently, in (b) and (c) of FIG. 18, all the control gate lines CG0 to CG15 in the sector SEC0 are set to the high level, for example, 1.8 V. As explained above, the operation of the level converting circuit LVLC0 is also used for the change to the high level of the control gate lines CG0 to CG15.

In (d) and (e) of FIG. 18, the transistors N5 of the selection gate drivers SGDRV0 to SGDRV3 illustrated in FIG. 13 are turned on according to the high-level row decode signals GSGB0 to GSGB3. The selection gate lines SG0 to SG15 are maintained at the low level, for example, 0 V. Therefore, a memory cell current may be prevented from flowing to the memory cells MC while the switch circuits TRSW0 to TRSW15 are on.

In (f) of FIG. 18, after the voltage line VSGH changes to the low level, for example, 0 V and the switch circuits TRSW0 to TRSW15 are turned off, the row decode signals GSGN0 and GSGB0 corresponding to the memory cell MC to be accessed change to the low level, for example, 0 V. The row decode signals VSG1 to VSG3 and VSGB1 to VSGB3 corresponding to the memory cells MC not to be accessed respectively change to the low level, for example, 0 V and the high level, for example, 1.8 V ((g) of FIG. 18). Consequently, in (h) of FIG. 18, the selection gate driver SGDRV0 drives the selection gate line SG0 to the high level, for example, 1.8 V. As in FIG. 11, the readout operation is executed. Readout operation corresponding to the addresses A4 and A5 is the same as that illustrated in FIG. 11.

In this aspect, effects same as those in the aspects explained above may be obtained. Further, even when the address signals AD are sequentially supplied to the semiconductor memory MEM and the readout operation is continuously executed, the cell transistors CT may be quickly driven. As a result, readout access time may be reduced without increasing a chip size.

Figure 19:
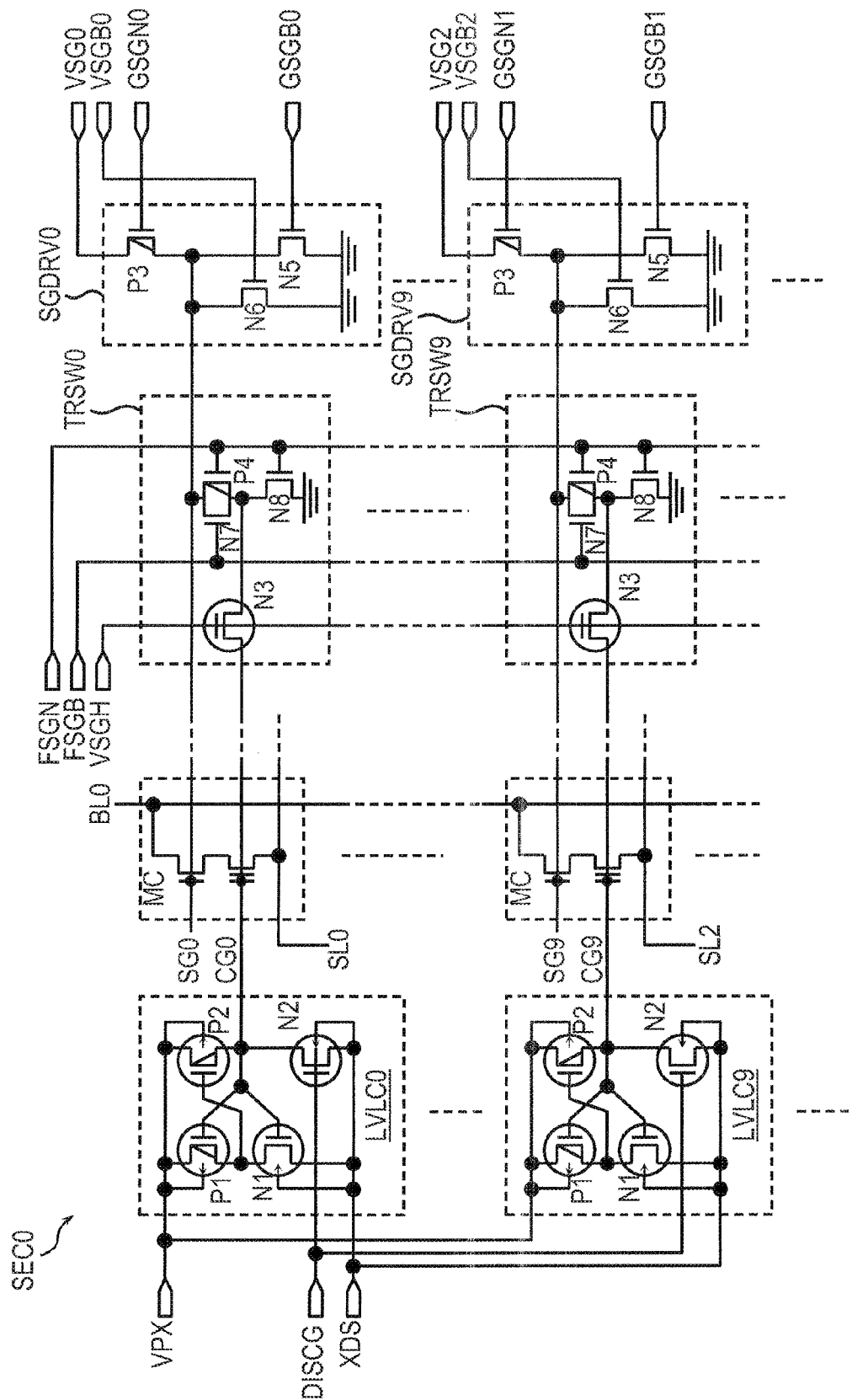
FIG. 19 illustrates a main part of a sector of the semiconductor memory according to the still other aspect.

FIG. 19 illustrates a main part of the sector SEC0 of the semiconductor memory MEM according to still another aspect of the present invention. Components same as those explained above in the aspects are denoted by the same reference numerals and signs and detailed explanation of the components is omitted. In the semiconductor memory MEM, the switch circuits TRSW0 to TRSW15 are different from those illustrated in FIG. 4. Other components are the same as those illustrates in FIGS. 1 to 3 except that the operation control circuit 14 generates control signals FSGN and FSGB.

For example, the semiconductor memory MEM is a flash memory of the NOR type. The semiconductor memory MEM operates synchronously with the clock signal CLK but may operate asynchronously with the clock signal CLK. The semiconductor memory MEM may be designed as a memory macro mounted on a system LSI or the like or may be designed as a semiconductor storage device encapsulated in a package. For example, the semiconductor memory MEM is mounted on the system SYS illustrated in FIG. 5.

The switch circuit TRSW0 includes nMOS transistors N7 and N8 and pMOS transistors P4 instead of the transistors N4, illustrated in FIG. 4. The switch circuits TRSW1 to TRSW15 are the same as the switch circuit TRSW0. The transistors N7 and P4 function as CMOS transfer switches. The transistors N8 are arranged between the control gate line CG0 and the ground line. Gates of the transistors N7 are coupled to a control signal line FSGB. Gates of the transistors P4 and N8 are coupled to a control signal line FSGN. Although not specifically limited, the control signal lines FSGB and FSGN are wired in common to all the sectors SEC0 to SEC3.

The transistors N7, N8, and P4 are formed by using a CMOS process having a normal withstanding voltage, for example, 2 V. Therefore, a layout area of the transistors N7, N8, and P4 is small compared with a layout area of the transistor N4 having the high withstanding voltage illustrated in FIG. 4. Operation speed of the CMOS transfer switches is higher than operation speed of the transistors N4 illustrated in FIG. 4. Consequently, the switch circuits TRSW0 to TRSW15 having a small area and operate at high speed may be formed.

The CMOS transfer switches are turned on when the control signal lines FSGB and FSGN are at the high level and the low level, respectively. When the CMOS transfer switches are on, the control gate line CG0 is coupled to the selection gate line SG0. When the control signal lines FSGB and FSGN are at the low level and the high level, respectively, the CMOS transfer switches are turned off and the transistors N8 are turned on. Consequently, the control gate line CG0 is separated from the selection gate line SG0 and set to the low level, for example, 0 V.

FIG. 20 illustrates an example of voltages of signal lines applied when the semiconductor memory MEM illustrated in FIG. 19 operates. In this example, in the readout operation (RD), the control signal lines FSGB and FSGN are respectively set to the high level, for example, 1.8 V and the low level, for example, 0 V. Voltages of the other signal lines are the same as those illustrated in FIG. 6. Timing for changing the voltages of the control signal lines FSGB and FSGN is the same as the timing for changing the voltage of the voltage line VSGH illustrated in FIG. 7. Consequently, the switch circuits TRSW0 to TRSW15 are turned on. The control gate line CG, for example, the control gate line CG0 coupled to the memory cell MC to be accessed is coupled to the selection gate line SG, for example, the selection gate line SG0.

Timing of the readout operation is the same as that illustrated in FIG. 7 except that the voltage line VSGL is not present. However, in this aspect, the control gate lines CG are coupled to the selection gate lines SG via the transistors N3 having the high withstanding voltage and the transistors N7 and P4 having the normal withstanding voltage. Since the load of the switch circuits TRSW0 to TRSW15 is small, the control gate lines CG quickly rise to the high level compared with FIG. 7. Timing when the level converting circuits LVLC0 to LVLC3 start operation is earlier. As a result, readout access time may be reduced compared with FIG. 7.

In the program operation (PRG), the control signal lines FSGB and FSGN are also respectively set to the high level, for example, 1.8 V and the low level, for example, 0 V. Voltages of the other signal lines are the same as those illustrated in FIG. 6. Timing of the program operation is the same as that illustrated in FIG. 8 except that the voltage line VSGL is not present. However, like the readout operation, since the operation speed of the switch circuits TRSW0 to TRSW15 may be increased, program operation time may be reduced compared with FIG. 8.

In the erasing operation (ERS), the control signal liens FSGB and FSGN are respectively set to the low level, for example 0 V, and the high level, for example 1.8 V. The CMOS transfer switches are turned off and the transistors N8 are turned on. At this point, the nodes on the opposite side of the control gate lines CG of the transistors N3 having the high withstanding voltage are set to the low level, for example 0 V. Consequently, as in FIG. 13, since one transistor N3 having the high withstanding voltage is used, voltage exceeding the withstanding voltage is prevented from being applied to the transistors during the erasing operation. Timing of the erasing operation is the same as that illustrated in FIG. 9 except that the voltage line VSGL is not present.

In this aspect, effects same as that in the aspects explained above may be obtained. Further, since the transistors N7, N8, and P4 are arranged instead of the transistors N4 having the high withstanding voltage illustrated in FIG. 4, the cell transistors CT may be quickly driven. As a result, readout access time and program time may be reduced without increasing a chip size.

Figure 21:
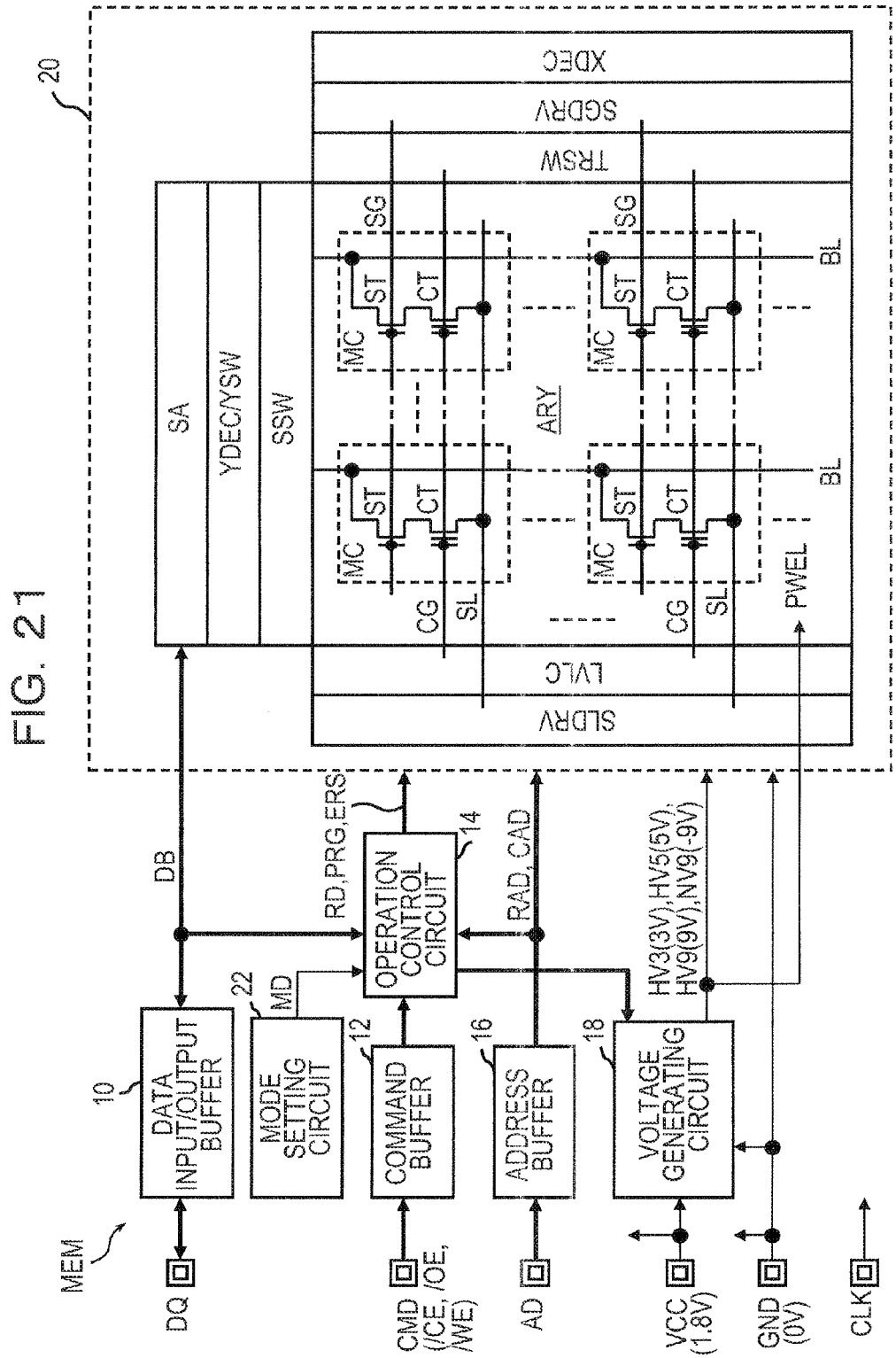
FIG. 21 illustrates an example of a semiconductor memory according to still another aspect.

FIG. 21 illustrates an example of a semiconductor memory MEM according to still another aspect of the present invention. Components same as those explained in the aspects are denoted by the same reference numerals and signs and detailed explanation of the components is omitted. In the semiconductor memory MEM, a mode setting circuit 22 is added to the semiconductor memory MEM illustrated in FIG. 1. Other components are the same as those illustrated in FIGS. 1 to 4, except that a function of the operation control circuit 14 is different.

For example, the semiconductor memory MEM is a flash memory of the NOR type. The semiconductor memory MEM operates synchronously with the clock signal CLK but may operate asynchronously with the clock signal CLK. The semiconductor memory MEM may be designed as a memory macro mounted on a system LSI or the like or may be designed as a semiconductor storage device encapsulated in a package. For example, the semiconductor memory MEM is mounted on the system SYS illustrated in FIG. 5.

The mode setting circuit 22 sets a mode signal MD to the low level during a first mode and sets the mode signal MD to the high level during a second mode. For example, when the command buffer 12 receives a mode setting command via the command terminal CMD, the mode setting circuit 22 sets a logical level of the mode signal MD according to a bit value of the address signal AD or the data signal DQ.

The operation control circuit 14 actuates the semiconductor memory MEM in the first mode or the second mode according to the logical level of the mode signal MD. Specifically, when a mode signal line MD of the low level is received (the first mode), the operation control circuit 14 executes the readout operation at the timing illustrated in FIG. 7. When a mode signal line MD of the high level is received (the second mode), the operation control circuit 14 executes the readout operation at the timing illustrated in FIGS. 10 and 11. In the first mode (the timing illustrated in FIG. 7), the control gate line CG coupled to the memory cell MC to be accessed is driven. Therefore, disturbance on the semiconductor memory MEM may be reduced. In the second mode, since the plurality of control gate lines CG are simultaneously driven, readout access time may be reduced. Timing of the program operation and the erasing operation is the same as that illustrated in FIGS. 8 and 9 irrespective of the operation mode. Consequently, one semiconductor memory MEM may be used as two kinds of semiconductor memory MEM having different readout operation specifications.

The logical level of the mode signal MD may be set according to a program state of a program circuit such as a fuse circuit provided in the mode setting circuit 22. Alternatively, the logical level of the mode signal MD may be set by coupling the mode signal line MD to the ground line GND or the power supply line VCC. For example, the mode signal line MD is coupled to the ground line GND or the power supply line VCC according to a type of a photomask used in a wiring process during manufacturing of the semiconductor memory MEM. Alternatively, a user may dynamically switch the logical level of the mode signal MD according to a use.

As explained above, in this aspect, effects same as those of the aspects explained above may be obtained. Further, the cell transistors CT may be quickly driven without increasing a chip size by using a plurality of operation modes.

In the examples explained above, the aspects are applied to the flash memory of the NOR type. However, for example, the aspects may be applied to other semiconductor memories having the memory cells MC including the cell transistors CT and the selection transistors ST.

The mode setting circuit 22 illustrated in FIG. 21 may be added to the semiconductor memory MEM illustrated in FIG. 12 or 19.

In the aspects disclosed above, since the control gate lines are coupled to the selection gate lines via the switch circuits, the control gate lines may be driven by using voltage supplied to the selection gate line in order to select a selection transistor. Consequently, the cell transistors may be driven synchronously with driving timing for the selection transistors without forming a special driver for the cell transistors. As a result, the cell transistors may be quickly driven without increasing a chip size. In particular, in the readout operation that does not require a high voltage, the cell transistors may be quickly driven.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the aspects of the present inventions have been described in detail, it should be understood that the various changes, substitutions, and alterations could be made hereto without departing from the spirit and scope of the invention.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

What is claimed is:
1. A semiconductor memory comprising:
  a memory cell including a cell transistor and a selection transistor;
  a control gate line coupled to a gate electrode of the cell transistor;

a selection gate line coupled to a gate electrode of the selection transistor;
a selection gate driver configured to apply a voltage to the selection gate line;
a switch circuit configured to couple the control gate line to the selection gate line; and
a level converting unit coupled to the control gate line and a voltage line and configured to convert a voltage of the control gate line into a voltage of the voltage line.

2. The semiconductor memory according to claim 1, further comprising:
a memory cell array in which a plurality of the memory cells are arranged; and
a selection gate driver unit in which the selection gate driver is arranged, wherein
the switch circuit is arranged between the memory cell array and the selection gate driver unit.

3. The semiconductor memory according to claim 1, further comprising a control circuit configured to control, in readout operation, the selection gate driver to turn on the switch circuit and output first level voltage to the selection gate line coupled to the memory cell, wherein
the level converting unit converts, in the readout operation, the first level voltage of the control gate line into second level voltage of the voltage line.

4. The semiconductor memory according to claim 2, further comprising a control circuit configured to control, in the readout operation, operation of the selection gate driver to turn off the switch circuit after keeping the switch circuit on for a certain period and output first level voltage to the selection gate line when the switch circuit is on and configured to control operation of the selection gate driver to output, after turning off the switch circuit, third level voltage lower than the first level to the selection gate line coupled to the memory cell not to be accessed,
wherein the level converting unit converts, in the readout operation, the first level voltage of the control gate line into second level voltage of the voltage line.

5. The semiconductor memory according to claim 4, wherein the control circuit controls the selection gate driver to output, after turning off the switch circuit, when an address signal indicating the memory cell to be accessed is changed, the first level voltage to the selection gate line coupled to the memory cell to be accessed and output the third level voltage to the selection gate line coupled to the memory cell not to be accessed.

6. The semiconductor memory according to claim 1, further comprising:
a mode setting unit configured to set an operation mode of the semiconductor memory in a first mode or a second mode; and
a control circuit configured to control operation of the switch circuit and the selection gate driver, wherein
when an operation mode of the semiconductor memory is set in the first mode, in readout operation,
the control circuit controls the selection gate driver to turn on the switch circuit and output first level voltage to the selection gate line coupled to the memory cell to be accessed,
the level converting unit converts the first level voltage of the control gate line into second level voltage of the voltage line, and
when the operation mode of the semiconductor memory is set in the second mode, in the readout operation,
the control circuit controls the selection gate driver to turn off the switch circuit after keeping the switch circuit on for a certain period and controls the selection gate driver to output, when the switch circuit is on, the first level voltage to the selection gate line and output, after turning off the switch circuit, third level voltage lower than the first level voltage to the selection gate line coupled to the memory cell not to be accessed, and
the level converting unit coverts the first level voltage of the control gate line into the second level voltage.

7. The semiconductor memory according to claim 1, further comprising:
a floating gate provided in the cell transistor;
a source line coupled to the memory cell;
a source driver configured to set, in program operation, the source line to writing voltage to feed an electric current to the memory cell; and
a control circuit configured to control, in the program operation, the selection gate driver to turn on the switch circuit and output first level voltage to the selection gate line, wherein
the level converting unit converts, in the program operation, the first level voltage of the control gate line into fourth level voltage higher than the first level voltage in order to trap charges in the floating gate.

8. The semiconductor memory according to claim 1, further comprising:
a negative-voltage setting circuit configured to set the control gate line to negative voltage;
an erasing voltage setting circuit setting, in order to draw charges from a floating gate provided in the cell transistor to a channel region; and
a control circuit configured to control, in erasing operation, the selection gate driver to turn off the switch circuit and stop voltage output to the selection gate line, wherein
the level converting unit stops converting operation of the level converting unit in the erasing operation.

9. The semiconductor memory according to claim 8, wherein
the switch circuit includes a first transfer transistor and a second transfer transistor coupled in series between the control gate line and the selection gate line, wherein
the control circuit controls the switch circuit to turn off the first transfer transistor and the second transfer transistor in the erasing operation.

10. The semiconductor memory according to claim 9, wherein the control circuit outputs, in the erasing operation, the negative voltage to a gate of the first transfer transistor and outputs ground voltage to a gate of the second transfer transistor.

11. The semiconductor memory according to claim 9, wherein the switch circuit comprises a ground switch that couples, in the erasing operation, a coupling node, to which the first transfer transistor and the second transfer transistor are coupled, to a ground line.

12. The semiconductor memory according to claim 2, further comprising:
a first decoder that selects a certain number of selection gate drivers including the memory cell to be accessed; and
a second decoder that outputs the first level voltage to the certain number of selection gate drivers including the memory cell to be accessed, wherein
the selection gate driver that is selected by the first decoder and receives the first level voltage from the second decoder outputs the first level voltage to the selection gate line, and
one end of the switch circuit is coupled to the control gate line, the other end thereof is coupled to an output of the second decoder, and the other end is coupled to the selection gate line via the selection gate driver.

13. The semiconductor memory according to claim 12, wherein the switch circuit further includes a transfer transistor that is coupled between the control gate line and the selection gate line and is turned off during erasing operation.

14. An operation method of a semiconductor memory comprising a memory cell including a cell transistor and a selection transistor, a control gate line coupled to a gate of the cell transistor, a selection gate line coupled to a gate of the selection transistor, a selection gate driver configured to apply a certain voltage to the selection gate line, a switch circuit configured to couple the control gate line to the selection gate line, and a level converting unit coupled to the control gate line and a voltage line and configured to convert a voltage of the control gate line into a voltage supplied to the voltage line, the operation method comprising:
   in readout operation,
   turning on the switch circuit;
   outputting a first level voltage from the selection gate driver to the selection gate line;
   converting, with the level converting unit, the first level voltage of the control gate line into second level voltage of the voltage line; and
   determining data stored in the memory cell based on an amount of an electric current flowing through a bit line.

15. An operation method of a semiconductor memory comprising a plurality of memory cells respectively including cell transistors and selection transistors, control gate lines respectively coupled to gates of the cell transistors, selection gate lines respectively coupled to gates of the selection transistors, selection gate drivers respectively configured to apply a certain voltages to the selection gate lines, switch circuits respectively configured to couple the control gate lines to the selection gate lines, and a level converting unit connected to the control gate lines and voltage lines and configured to convert a voltage of the control gate lines into a voltage supplied to the voltage lines, the operation method comprising:
   in readout operation,
   turning off the switch circuits after keeping the switch circuits on for a certain period;
   outputting first level voltage to all the selection gate lines from all the selection gate drivers when the switch circuits are on;
   outputting, after turning off the switch circuits, third level voltage lower than the first level voltage from the selection gate driver corresponding to the memory cells not to be accessed to the selection gate lines coupled to the memory cells not to be accessed;
   converting, with the level converting unit, the first level voltage of the control gate lines into a second level voltage of the voltage lines; and
   determining data stored in the memory cell to be accessed based on an amount of an electric current flowing through the bit lines.

16. The operation method according to claim 14, further comprising:
   in program operation,
   turning on the switch circuit;
   outputting the first level voltage from the selection gate driver to the selection gate line;
   converting, with the level converting unit, the first level voltage of the control gate line into the third level voltage higher than the first level voltage;
   setting a source line of the memory cell to writing voltage;
   feeding an electric current from the source line to the bit line via the memory cell; and
   trapping charges in a floating gate provided in the cell transistor of the memory cell.

17. The operation method according to claim 14, further comprising:
   in erasing operation,
   turning off the switch circuit;
   stopping output of a voltage to the selection gate line coupled to the memory cell;
   stopping converting operation for a voltage level by the level converting unit;
   setting the control gate line of the memory cell to a negative voltage;
   setting a channel region of the cell transistor of the memory cell to an erasing voltage; and
   drawing charges from a floating gate provided in the cell transistor of the memory cell to the channel region.

18. A semiconductor device comprising:
   a memory cell including a cell transistor and a selection transistor;
   a control gate line coupled to a gate electrode of the cell transistor;
   a selection gate line coupled to a gate electrode of the selection transistor;
   a selection gate driver configured to apply a voltage to the selection gate line;
   a switch circuit configured to couple the control gate line to the selection gate line;
   a level converting unit coupled to the control gate line and a voltage line and configured to convert a voltage of the control gate line into a voltage of the voltage line; and
   a memory controller accessing the memory cell.

* * * * *